United States Patent
Gonzalez et al.

(10) Patent No.: US 7,224,607 B2
(45) Date of Patent: May 29, 2007

(54) FLASH MEMORY DATA CORRECTION AND SCRUB TECHNIQUES

(75) Inventors: Carlos J. Gonzalez, Los Gatos, CA (US); Kevin M. Conley, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 47 days.

(21) Appl. No.: 11/271,553

(22) Filed: Nov. 10, 2005

(65) Prior Publication Data

US 2006/0062048 A1 Mar. 23, 2006

Related U.S. Application Data

(62) Division of application No. 10/678,345, filed on Oct. 3, 2003, now Pat. No. 7,012,835.

(51) Int. Cl.
*G11C 11/34* (2006.01)

(52) U.S. Cl. .............. 365/185.11; 365/185.33; 365/230.03

(58) Field of Classification Search ........... 365/185.11, 365/185.33, 230.03
See application file for complete search history.

(56) References Cited

U.S. PATENT DOCUMENTS

| | | |
|---|---|---|
| 4,139,911 A | 2/1979 | Sciulli et al. |
| 4,218,764 A | 8/1980 | Furuta et al. |
| 4,253,059 A | 2/1981 | Bell et al. |
| 4,460,982 A | 7/1984 | Gee et al. |
| 4,612,630 A | 9/1986 | Rosier |
| 4,694,454 A | 9/1987 | Matsuura |
| 4,703,196 A | 10/1987 | Arakawa |
| 4,703,453 A | 10/1987 | Shinoda et al. |
| 4,733,394 A | 3/1988 | Giebel |
| 4,763,305 A | 8/1988 | Kuo |
| 4,779,272 A | 10/1988 | Kohda et al. |

(Continued)

FOREIGN PATENT DOCUMENTS

EP 0 791 933 B1 8/1997

(Continued)

OTHER PUBLICATIONS

ISA/EPO, "Invitation to Pay Additional Fees (including Partial International Search Report)", mailed on Feb. 21, 2005 in corresponding PCT/US2004/031788, 5 pages.

(Continued)

*Primary Examiner*—Richard T. Elms
*Assistant Examiner*—Pho M. Luu
(74) *Attorney, Agent, or Firm*—Parsons Hsue & de Runtz LLP

(57) ABSTRACT

In order to maintain the integrity of data stored in a flash memory that are susceptible to being disturbed by operations in adjacent regions of the memory, disturb events cause the data to be read, corrected and re-written before becoming so corrupted that valid data cannot be recovered. The sometimes conflicting needs to maintain data integrity and system performance are balanced by deferring execution of some of the corrective action when the memory system has other high priority operations to perform. In a memory system utilizing very large units of erase, the corrective process is executed in a manner that is consistent with efficiently rewriting an amount of data much less than the capacity of a unit of erase.

28 Claims, 8 Drawing Sheets

U.S. PATENT DOCUMENTS

| | | | |
|---|---|---|---|
| 4,799,195 A | 1/1989 | Iwahashi et al. | |
| 4,809,231 A | 2/1989 | Shannon et al. | |
| 4,827,450 A | 5/1989 | Kowalski | |
| 4,937,787 A | 6/1990 | Kobatake | |
| 4,962,322 A | 10/1990 | Chapman | |
| 4,964,079 A | 10/1990 | Devin | |
| 5,043,940 A | 8/1991 | Harari | |
| 5,065,364 A | 11/1991 | Atwood et al. | |
| 5,070,032 A | 12/1991 | Yuan et al. | |
| 5,095,344 A | 3/1992 | Harari | |
| 5,119,330 A | 6/1992 | Tanagawa | |
| 5,122,985 A | 6/1992 | Santin | |
| 5,132,935 A | 7/1992 | Ashmore, Jr. | |
| 5,151,906 A | 9/1992 | Sawada | |
| 5,157,629 A | 10/1992 | Sato et al. | |
| 5,172,338 A | 12/1992 | Mehrotra et al. | |
| 5,200,922 A | 4/1993 | Rao | |
| 5,200,959 A | 4/1993 | Gross et al. | |
| 5,239,505 A | 8/1993 | Fazio et al. | |
| 5,262,984 A | 11/1993 | Noguchi et al. | |
| 5,263,032 A | 11/1993 | Porter et al. | |
| 5,270,551 A | 12/1993 | Kamimura et al. | |
| 5,270,979 A | 12/1993 | Harari et al. | |
| 5,278,794 A | 1/1994 | Tanaka et al. | |
| 5,313,421 A | 5/1994 | Guterman et al. | |
| 5,313,427 A | 5/1994 | Schreck et al. | |
| 5,315,541 A | 5/1994 | Harari et al. | |
| 5,321,655 A | 6/1994 | Iwahashi et al. | |
| 5,327,383 A | 7/1994 | Merchant et al. | |
| 5,335,198 A | 8/1994 | Van Buskirk et al. | |
| 5,341,334 A | 8/1994 | Maruyama | |
| 5,343,063 A | 8/1994 | Yuan et al. | |
| 5,347,489 A | 9/1994 | Merchant et al. | |
| 5,365,486 A | 11/1994 | Schreck | |
| 5,377,147 A | 12/1994 | Merchant et al. | |
| 5,394,359 A | 2/1995 | Kowalski | |
| 5,404,485 A | 4/1995 | Ban | |
| 5,465,236 A | 11/1995 | Naruke | |
| 5,475,693 A | 12/1995 | Christopherson et al. | |
| 5,504,760 A | 4/1996 | Harari et al. | |
| 5,523,972 A | 6/1996 | Rashid et al. | |
| 5,532,962 A | 7/1996 | Auclair et al. | |
| 5,570,315 A | 10/1996 | Tanaka et al. | |
| 5,583,812 A | 12/1996 | Harari | |
| 5,648,934 A | 7/1997 | O'Toole | |
| 5,652,720 A | 7/1997 | Aulas et al. | |
| 5,657,332 A | 8/1997 | Auclair et al. | |
| 5,661,053 A | 8/1997 | Yuan | |
| 5,675,537 A | 10/1997 | Bill et al. | |
| 5,689,465 A | 11/1997 | Sukegawa et al. | |
| 5,699,297 A | 12/1997 | Yamazaki et al. | |
| 5,703,506 A | 12/1997 | Shook et al. | |
| 5,712,815 A | 1/1998 | Bill et al. | |
| 5,717,632 A | 2/1998 | Richart et al. | |
| 5,751,639 A | 5/1998 | Ohsawa | |
| 5,761,125 A | 6/1998 | Himeno | |
| 5,774,397 A | 6/1998 | Endoh et al. | |
| 5,798,968 A | 8/1998 | Lee et al. | |
| 5,835,413 A | 11/1998 | Hurter et al. | |
| 5,889,698 A | 3/1999 | Miwa et al. | |
| 5,890,192 A | 3/1999 | Lee et al. | |
| 5,905,673 A | 5/1999 | Khan | |
| 5,909,449 A | 6/1999 | So et al. | |
| 5,930,167 A | 7/1999 | Lee et al. | |
| 5,937,425 A | 8/1999 | Ban | |
| 5,963,473 A | 10/1999 | Norman | |
| 6,046,935 A | 4/2000 | Takeuchi et al. | |
| 6,145,051 A | 11/2000 | Estakhri et al. | |
| 6,151,246 A | 11/2000 | So et al. | |
| 6,199,139 B1 | 3/2001 | Katayama et al. | |
| 6,222,762 B1 | 4/2001 | Guterman et al. | |
| 6,345,001 B1 | 2/2002 | Mokhlesi | |
| 6,415,352 B1 | 7/2002 | Asami et al. | |
| 6,426,893 B1 | 7/2002 | Conley et al. | |
| 6,456,528 B1 | 9/2002 | Chen | |
| 6,522,580 B2 | 2/2003 | Chen et al. | |
| 6,560,152 B1 | 5/2003 | Cernea | |
| 6,567,307 B1 | 5/2003 | Estakhri | |
| 6,678,785 B2 | 1/2004 | Lasser | |
| 6,760,255 B2 * | 7/2004 | Conley et al. | 365/185.11 |
| 6,763,424 B2 | 7/2004 | Conley | |
| 6,772,274 B1 | 8/2004 | Estakhri | |
| 2003/0109093 A1 | 6/2003 | Harari et al. | |

FOREIGN PATENT DOCUMENTS

| | | |
|---|---|---|
| GB | 2289779 A | 11/1995 |
| JP | 8-147988 | 6/1996 |
| JP | 8-279295 | 10/1996 |
| JP | 2000-187992 | 7/2000 |
| WO | WO 9012400 | 10/1990 |
| WO | WO 02/058074 | 7/2002 |

OTHER PUBLICATIONS

ISA/EPO, "Notification of Transmittal of the International Search Report and the Written Opinion of the International Searching Authority, or the Declaration", mailed on May 31, 2005 in corresponding PCT/US2004/031788, 22 pages.

Lee, E.K.F., et al., "Error Correction Technique for Multivalued MOS Memory," *Electronic Letters*, vol. 27, No. 15 (Jul. 19, 1991), pp. 1321-1323.

Communucation Puruant to Article 96(2) EPC for Application No. 98307184.6 for SanDisk Corporation dated Aug. 8, 2005, 5 pages.

European Patent Office, "Substantive Examination," mailed in European Application No. 04 785 192.8 on Aug. 10, 2006, 5 pages.

* cited by examiner

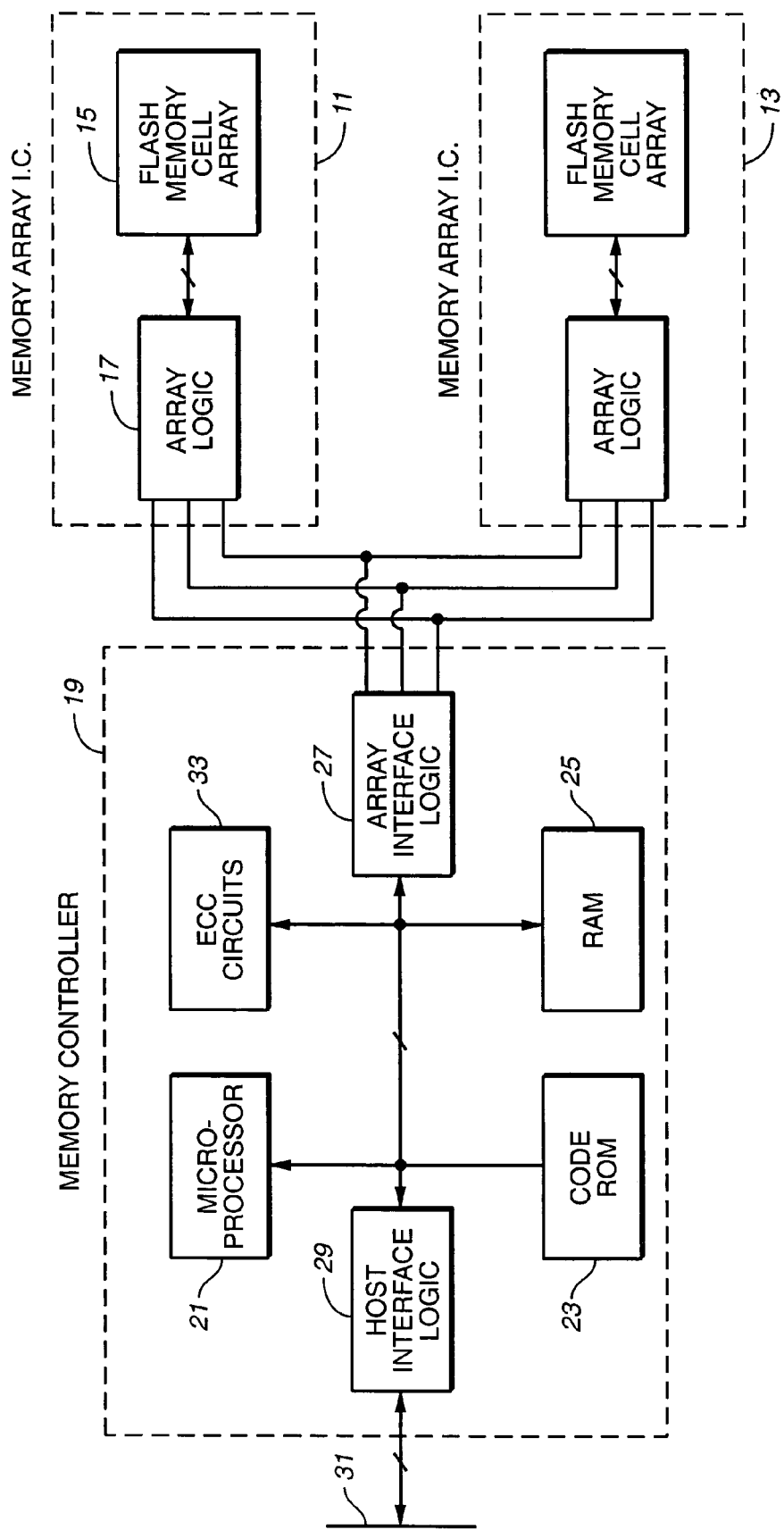
FIG._1A

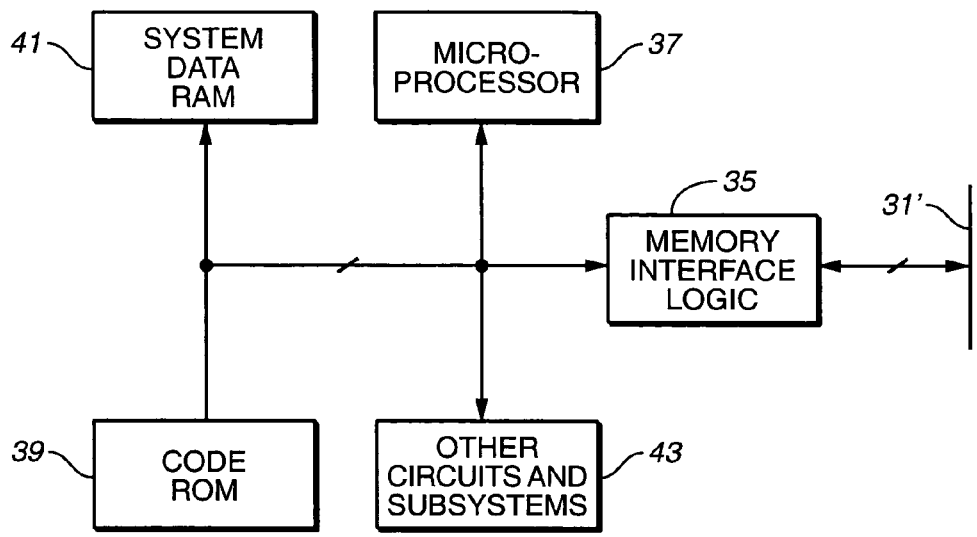
FIG._1B
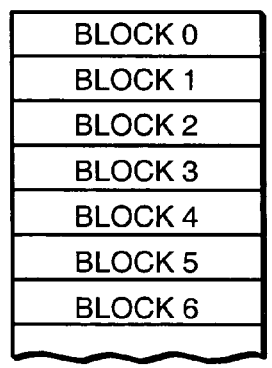
FIG._2
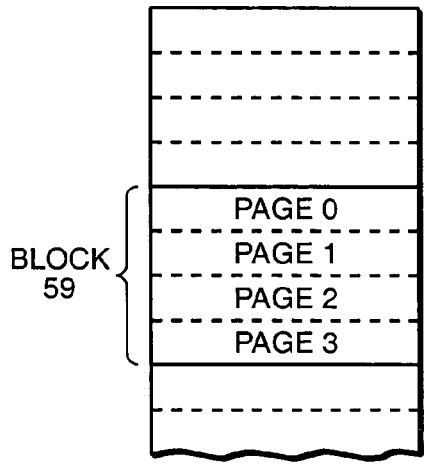
FIG._4
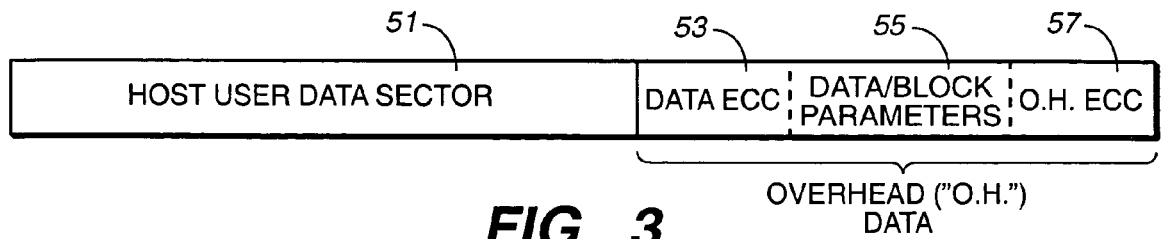
FIG._3

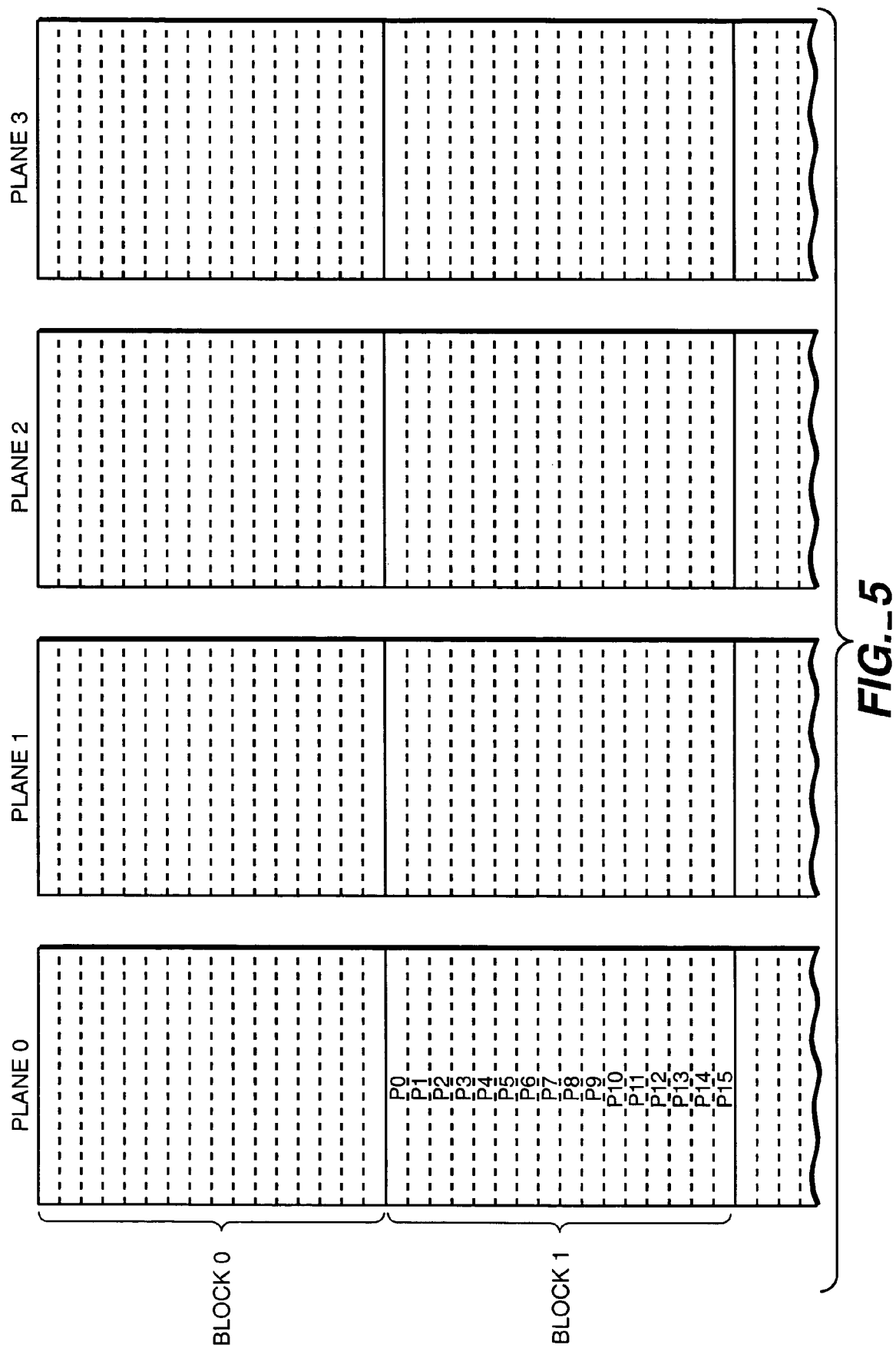
FIG._5

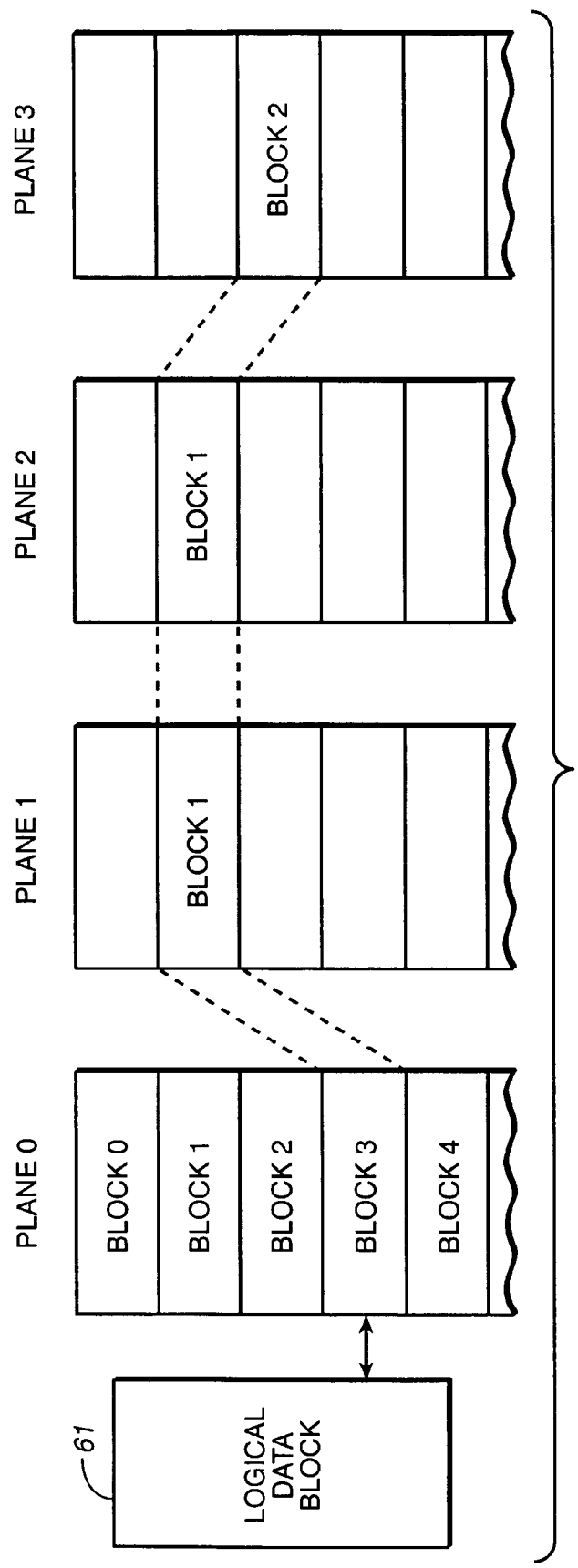
FIG._6
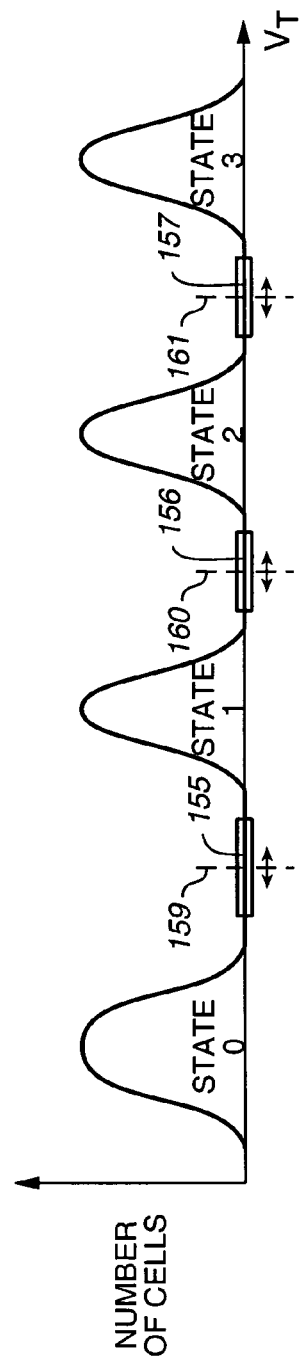
FIG._10

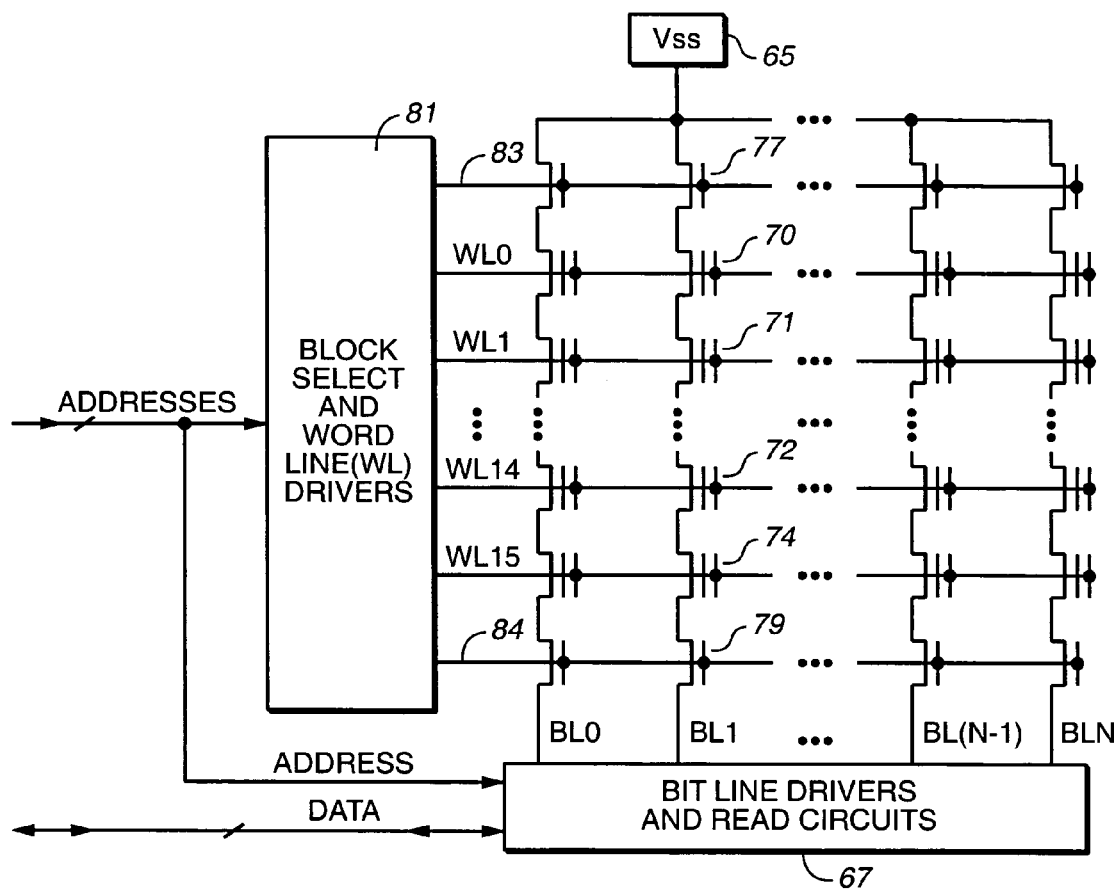
FIG._7

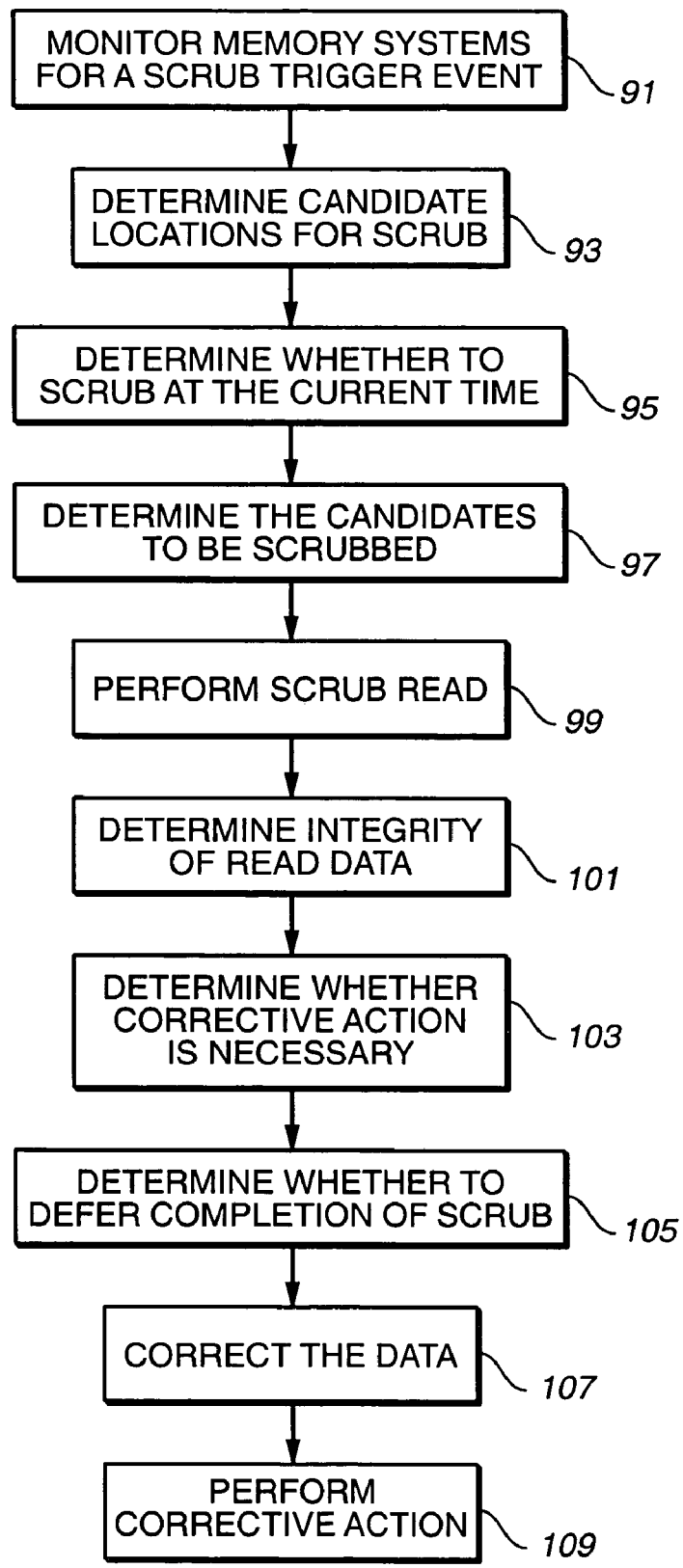
FIG._8

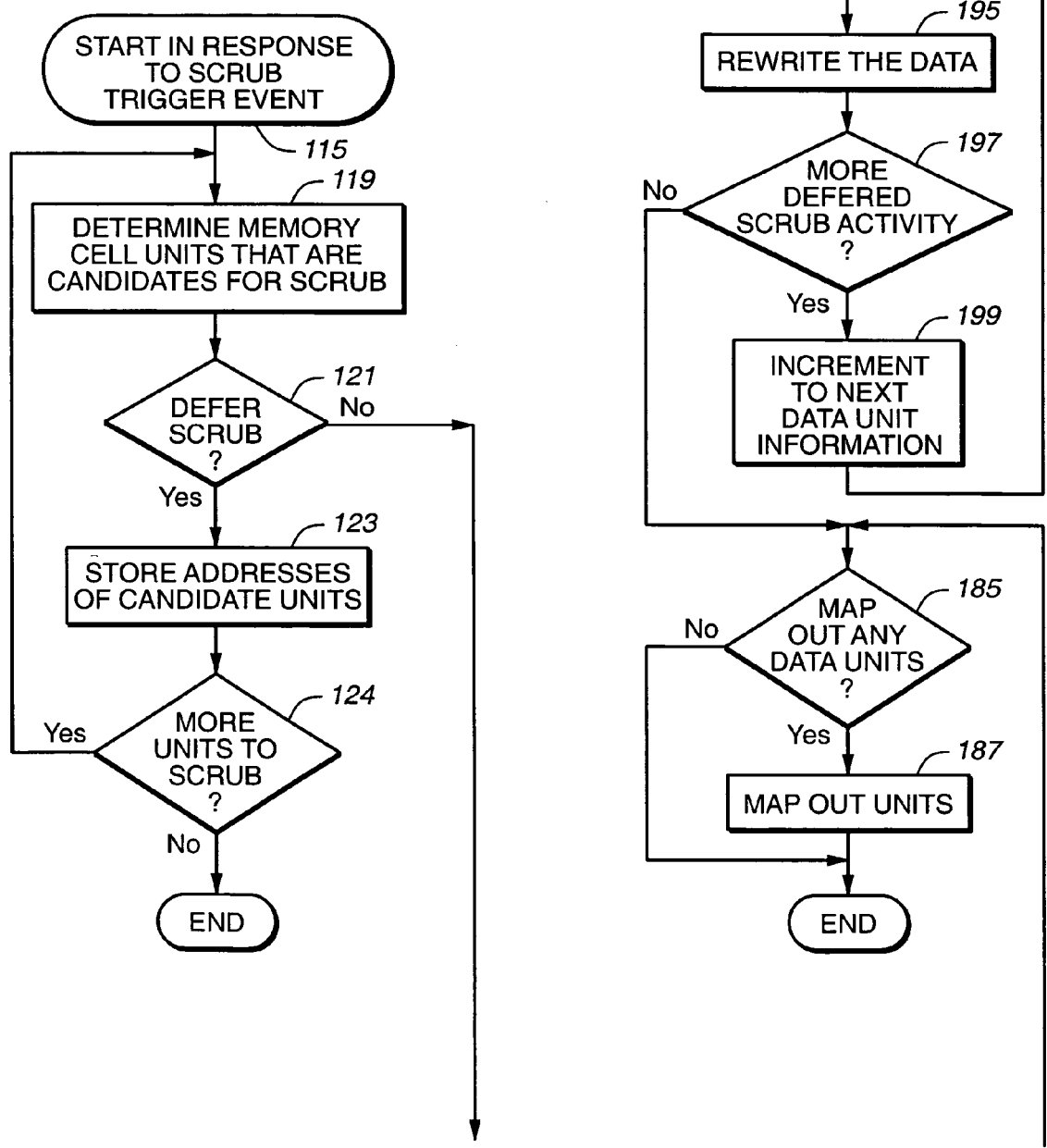

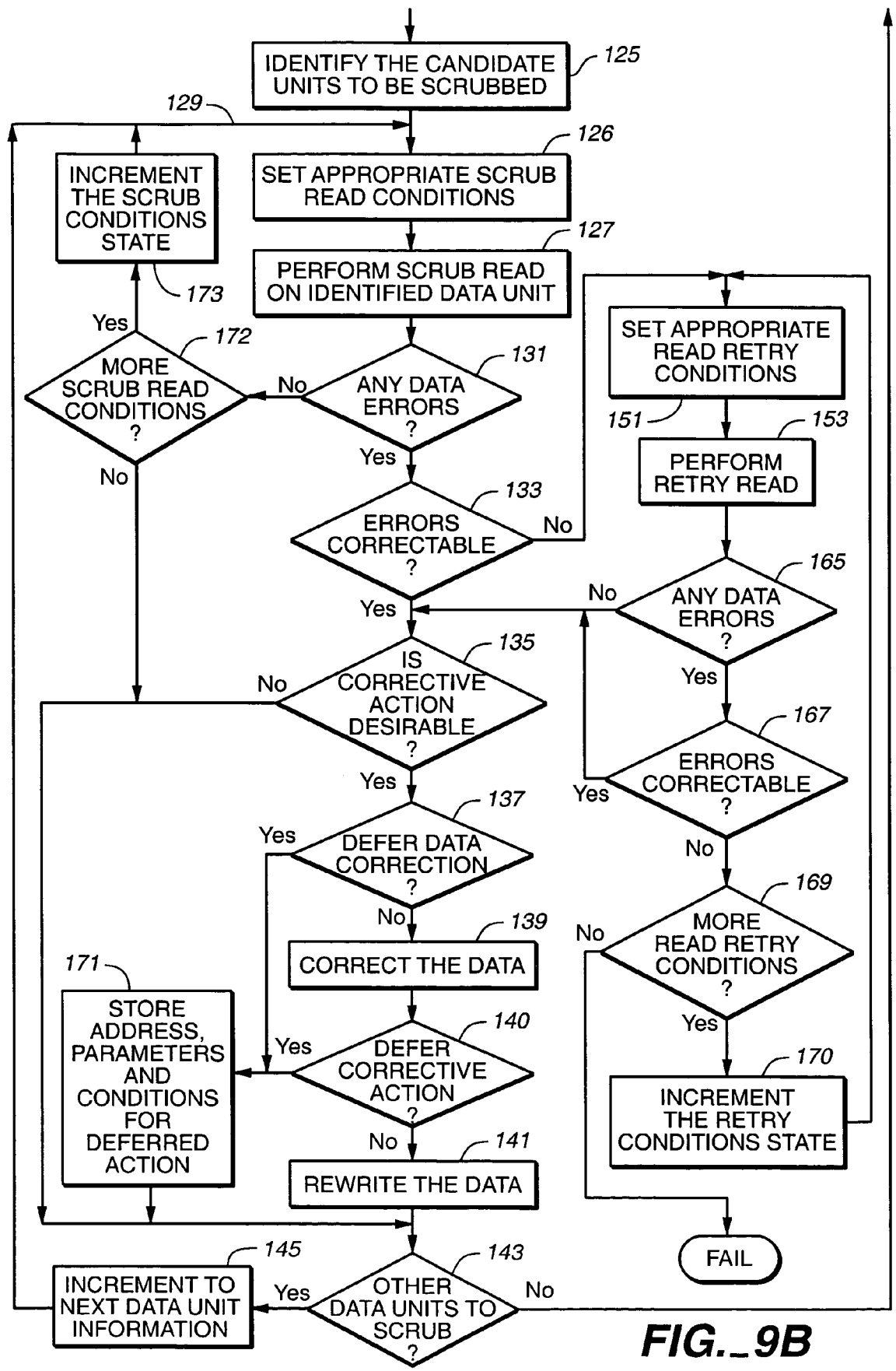
FIG._9B

FLASH MEMORY DATA CORRECTION AND SCRUB TECHNIQUES

CROSS REFERENCE TO RELATED APPLICATION

This application is a divisional of application Ser. No. 10/678,345, filed Oct. 3, 2003 now U.S. Pat. No. 7,012,835 entitled "Flash Memory Data Correction and Scrub Techniques" which application is incorporated herein by this reference for all purposes.

BACKGROUND

This invention relates generally to the operation of non-volatile flash memory systems, and, more specifically, to techniques of refreshing and correcting data stored therein, particularly in memory systems having very large memory cell blocks.

There are many commercially successful non-volatile memory products being used today, particularly in the form of small form factor cards, which employ an array of flash EEPROM (Electrically Erasable and Programmable Read Only Memory) cells formed on one or more integrated circuit chips. A memory controller, usually but not necessarily on a separate integrated circuit chip, interfaces with a host to which the card is removably connected and controls operation of the memory array within the card. Such a controller typically includes a microprocessor, some non-volatile read-only-memory (ROM), a volatile random-access-memory (RAM) and one or more special circuits such as one that calculates an error-correction-code (ECC) from data as they pass through the controller during the programming and reading of data. Some of the commercially available cards are CompactFlash™ (CF) cards, MultiMedia cards (MMC), Secure Digital (SD) cards, Smart Media cards, personnel tags (P-Tag) and Memory Stick cards. Hosts include personal computers, notebook computers, personal digital assistants (PDAs), various data communication devices, digital cameras, cellular telephones, portable audio players, automobile sound systems, and similar types of equipment. Besides the memory card implementation, this type of memory can alternatively be embedded into various types of host systems.

Two general memory cell array architectures have found commercial application, NOR and NAND. In a typical NOR array, memory cells are connected between adjacent bit line source and drain diffusions that extend in a column direction with control gates connected to word lines extending along rows of cells. A memory cell includes at least one storage element positioned over at least a portion of the cell channel region between the source and drain. A programmed level of charge on the storage elements thus controls an operating characteristic of the cells, which can then be read by applying appropriate voltages to the addressed memory cells. Examples of such cells, their uses in memory systems and methods of manufacturing them are given in U.S. Pat. Nos. 5,070,032, 5,095,344, 5,313,421, 5,315,541, 5,343,063, 5,661,053 and 6,222,762.

The NAND array utilizes series strings of more than two memory cells, such as 16 or 32, connected along with one or more select transistors between individual bit lines and a reference potential to form columns of cells. Word lines extend across cells within a large number of these columns. An individual cell within a column is read and verified during programming by causing the remaining cells in the string to be turned on hard so that the current flowing through a string is dependent upon the level of charge stored in the addressed cell. Examples of NAND architecture arrays and their operation as part of a memory system are found in U.S. Pat. Nos. 5,570,315, 5,774,397, 6,046,935, and 6,522,580.

The charge storage elements of current flash EEPROM arrays, as discussed in the foregoing referenced patents, are most commonly electrically conductive floating gates, typically formed from conductively doped polysilicon material. An alternate type of memory cell useful in flash EEPROM systems utilizes a non-conductive dielectric material in place of the conductive floating gate to store charge in a non-volatile manner. A triple layer dielectric formed of silicon oxide, silicon nitride and silicon oxide (ONO) is sandwiched between a conductive control gate and a surface of a semi-conductive substrate above the memory cell channel. The cell is programmed by injecting electrons from the cell channel into the nitride, where they are trapped and stored in a limited region, and erased by injecting hot holes into the nitride. Several specific cell structures and arrays employing dielectric storage elements and are described in U.S. Published patent application No. 2003/0109093.

As in most all integrated circuit applications, the pressure to shrink the silicon substrate area required to implement some integrated circuit function also exists with flash EEPROM memory cell arrays. It is continually desired to increase the amount of digital data that can be stored in a given area of a silicon substrate, in order to increase the storage capacity of a given size memory card and other types of packages, or to both increase capacity and decrease size. One way to increase the storage density of data is to store more than one bit of data per memory cell and/or per storage unit or element. This is accomplished by dividing a window of a storage element charge level voltage range into more than two states. The use of four such states allows each cell to store two bits of data, eight states stores three bits of data per storage element, and so on. Multiple state flash EEPROM structures using floating gates and their operation are described in U.S. Pat. Nos. 5,043,940 and 5,172,338, and for structures using dielectric floating gates in aforementioned U.S. application Ser. No. 10/280,352. Selected portions of a multi-state memory cell array may also be operated in two states (binary) for various reasons, in a manner described in U.S. Pat. Nos. 5,930,167 and 6,456,528.

Memory cells of a typical flash EEPROM array are divided into discrete blocks of cells that are erased together. That is, the block is the erase unit, a minimum number of cells that are simultaneously erasable. Each block typically stores one or more pages of data, the page being the minimum unit of programming and reading, although more than one page may be programmed or read in parallel in different sub-arrays or planes. Each page typically stores one or more sectors of data, the size of the sector being defined by the host system. An example sector includes 512 bytes of user data, following a standard established with magnetic disk drives, plus some number of bytes of overhead information about the user data and/or the block in which they are stored. Such memories are typically configured with 16, 32 or more pages within each block, and each page stores one or just a few host sectors of data.

In order to increase the degree of parallelism during programming user data into the memory array and read user data from it, the array is typically divided into sub-arrays, commonly referred to as planes, which contain their own data registers and other circuits to allow parallel operation such that sectors of data may be programmed to or read from each of several or all the planes simultaneously. An array on a single integrated circuit may be physically divided into planes, or each plane may be formed from a separate one or more integrated circuit chips. Examples of such a memory implementation are described in U.S. Pat. Nos. 5,798,968 and 5,890,192.

To further efficiently manage the memory, physical blocks may be logically linked together to form virtual blocks or metablocks. That is, each metablock is defined to include one block from each plane. Use of the metablock is described in international patent application publication no. WO 02/058074. The metablock is identified by a host logical block address as a destination for programming and reading data. Similarly, all blocks of a metablock are erased together. The controller in a memory system operated with such large blocks and/or metablocks performs a number of functions including the translation between logical block addresses (LBAs) received from a host, and physical block numbers (PBNs) within the memory cell array. Individual pages within the blocks are typically identified by offsets within the block address. Address translation often involves use of intermediate terms of a logical block number (LBN) and logical page.

Data stored in a metablock are often updated, the likelihood of updates as the data capacity of the metablock increases. Updated sectors of one logical metablock are normally written to another physical metablock. The unchanged sectors are usually also copied from the original to the new physical metablock, as part of the same programming operation, to consolidate the data. Alternatively, the unchanged data may remain in the original metablock until later consolidation with the updated data into a single metablock.

It is common to operate large block or metablock systems with some extra blocks maintained in an erased block pool. When one or more pages of data less than the capacity of a block are being updated, it is typical to write the updated pages to an erased block from the pool and then copy data of the unchanged pages from the original block to the erase pool block. Variations of this technique are described in aforementioned published international application no. WO 02/058074. Over time, as a result of host data files being re-written and updated, many blocks can end up with a relatively small number of its pages containing valid data and remaining pages containing data that is no longer current. In order to be able to efficiently use the data storage capacity of the array, logically related data pages of valid data are from time-to-time gathered together from fragments among multiple blocks and consolidated together into a fewer number of blocks. This process is commonly termed "garbage collection."

Individual flash EEPROM cells store an amount of charge in a charge storage element or unit that is representative of one or more bits of data. The charge level of a storage element controls the threshold voltage (commonly referenced as VT) of its memory cell, which is used as a basis of reading the storage state of the cell. A threshold voltage window is commonly divided into a number of ranges, one for each of the two or more storage states of the memory cell. These ranges are separated by guardbands that include a nominal sensing level that allows determining the storage states of the individual cells. These storage levels do shift as a result of charge disturbing programming, reading or erasing operations performed in neighboring or other related memory cells, pages or blocks. For example, programming of one set of memory cells sharing a line or circuit with a second set of memory cells can disturb the charge levels of the second set. The end result of this parasitic disturb is that if no corrective action is taken on the part of the storage system controller, data in exposed areas not being operated on may be corrupted, and in an extreme case, beyond the corrective capabilities of any error correcting codes (ECCs) stored along with the data. Such data corruption would then result in loss of data to the user, thus rendering the storage system unreliable. The extent and nature of such disturbs in a particular memory cell array depends upon its specific architecture, structure and operation.

Therefore, it is beneficial to restore shifting charge levels back to the centers of their state ranges from time-to-time, before disturbing operations cause them to shift completely out of their defined ranges, in which case erroneous data are then read. Such a process, termed data refresh or scrub, is described in U.S. Pat. Nos. 5,532,962 and 5,909,449. As a further aspect of this, in memory systems that use error correction codes (ECCs), some number of erroneous data bits read from the memory may be corrected by use of the ECC and the corrected data is then re-written to a previously erased portion of the memory. Re-writing the data causes each of the written memory cell threshold levels to be within its designated state range since data programming usually involves alternately adjusting the stored charge and read-verifying the resulting memory cell threshold level until it reaches the desired range that represents the data being stored in the cell.

SUMMARY OF THE INVENTION

A comprehensive scrub operation is included in a flash memory system to compensate for disturbs of storage levels in one group of memory cells that are caused by programming, reading or erasing operations performed on another group of memory cells on the same integrated circuit chip. The potential for such data disturbs increases as the memory cell arrays are shrunk in size. There is a tendency, in order to save space, for various signal lines to be shared among groups of memory cells such that one group experiences potentially repetitive exposure to voltages and/or currents during programming, reading or erasing the memory cells of another group. By scrubbing the data stored in all groups of memory cells in an organized and continuous manner, corruption of stored data over time is significantly reduced. Also, the storage of an increased number of bits per memory cell with an increased number of smaller voltage threshold state ranges is made practical when the disturbed charge levels are corrected by methodically restoring them to their intended levels.

A scrub operation entails reading data in areas that have received exposure to potentially disturbing signals, and performing some corrective action if this data is determined to have been disturbed. Disturbs may be detected, for example, by checking the integrity of the data, such as by reading the data and obtaining the results of an ECC check of the data. Corrective action may entail rewriting the data in the same location, or in a different location, and it can involve a higher-level defect or data management operation.

The scrubbing operation may be made adaptive to the integrity of the data read. For example, if one or a threshold level of data errors is found in one region of the memory cell array, the rate of scrubbing in that region may be increased. Conversely, if no errors or only a few data errors less than a threshold are found in a given region, this allows lowering the rate of scrubbing of the given region. The frequency and location of scrub may also be adapted to usage levels and other system parameters. These and other features of scrub are calculated to provide a balance between the need to maintain data integrity and the need to maintain a high level of system performance. Scrub operations not likely to improve data integrity are particularly avoided.

Scrub operations are preferably performed in the background, when the memory system is not reading or writing data. The memory system may look to the host to indicate when the host will not be asking the memory to store or retrieve data, during which time a scrub operation may be carried out.

Even if one or more data errors are detected in a particular scrub read, it might be determined not to take corrective action if the error(s) can be corrected by ECC upon reading the data, in order to maintain system performance. When user data and overhead data of the individual sectors have their own ECC, data errors in the overhead data are less likely to be allowed to go uncorrected than errors in the user data.

When there are too many bit errors for a scrub data read under normal conditions to be corrected by an ECC, the data can be re-read with more relaxed reference conditions in order to read cells whose stored charge levels have been shifted outside of the normal range. Once correctly verified by the ECC, the read data may then be re-written within normal charge range levels. Conversely, when a scrub read of data reveals no errors, that data may be re-read under more restrictive reference conditions in order to determine the quality of the stored data. That is, charge levels that have shifted outside their optimum ranges are detected so that they may be re-written back into such ranges as part of the scrub corrective action.

In memory systems utilizing large blocks or metablocks of memory cells that individually store a large number of host data sectors, a sector(s) of data of a first physical block that are corrected during a scrub operation may be re-written into a second block into which remaining data sectors of the first block are copied, consistent with the erase pooling method of memory management described above. Alternately, a block or metablock may be dedicated to the temporary storage of scrub corrected data sectors until other data sectors from the same blocks or metablocks as the corrected sector(s) need to be moved for some other reason, such as for garbage collection, at which time the scrub corrected data sectors may be recombined with other, data sectors of the same block or metablock. This improves system performance.

Once it is determined that corrective action needs to be taken with certain specified data, that action may be deferred if taking the corrective action at that time may adversely affect system performance, and if the data can be read without the corrective action, if necessary, before the corrective action later takes place. All corrected data, addresses and various parameters as determined at the time of deferral are temporarily stored and later retrieved when a deferred corrective action is executed. In systems organized in large blocks or metablocks of memory cells, corrective scrub actions may be deferred until a given amount of data from a given block or metablock are scheduled for corrective action, in which case all the deferred data sectors of the given block or metablock are corrected at the same time. This can reduce the amount of data copying and re-writing that occurs when the data sectors of the given block or metablock are consolidated together again.

Finally, if a given memory cell, column of cells, block of cells, or some other unit of cells exhibits is found to require frequent scrubbing, the unit may be mapped out of the system before it degrades to where data stored in it are no longer readable or correctable.

The foregoing features may be implemented individually or together in various combinations, depending upon the specific application. Additional aspects, advantages and features of the scrubbing system herein are included in the following description of exemplary examples thereof, which description should be taken in conjunction with the accompanying drawings. All patents, patent applications, articles and other publications referenced herein are hereby incorporated herein by this reference in their entirety for all purposes.

BRIEF DESCRIPTION OF THE DRAWINGS

FIGS. 1A and 1B are block diagrams of a non-volatile memory and a host system, respectively, that operate together;

FIG. 2 illustrates a first example organization of the memory array of FIG. 1A;

FIG. 3 shows an example host data sector with overhead data as stored in the memory array of FIG. 1A;

FIG. 4 illustrates a second example organization of the memory array of FIG. 1A;

FIG. 5 illustrates a third example organization of the memory array of FIG. 1A;

FIG. 6 shows an extension of the third example organization of the memory array of FIG. 1A;

FIG. 7 is a circuit diagram of a group of memory cells of the array of FIG. 1A with one particular configuration;

FIG. 8 is a flow diagram illustrating the major steps in a data scrub operation;

FIG. 9 is a flow diagram of a more specific example of a scrub operation; and FIG. 10 shows distributions of voltage threshold levels of a programmed group of memory cells.

DESCRIPTION OF EXEMPLARY EMBODIMENTS

Memory Architectures and Their Operation

Referring initially to FIG. 1A, a flash memory includes a memory cell array and a controller. In the example shown, two integrated circuit devices (chips) 11 and 13 include an array 15 of memory cells and various logic circuits 17. The logic circuits 17 interface with a controller 19 on a separate chip through data, command and status circuits, and also provide addressing, data transfer and sensing, and other support to the array 13. A number of memory array chips can be from one to many, depending upon the storage capacity provided. The controller and part or the entire array can alternatively be combined onto a single integrated circuit chip but this is currently not an economical alternative.

A typical controller 19 includes a microprocessor 21, a read-only-memory (ROM) 23 primarily to store firmware and a buffer memory (RAM) 25 primarily for the temporary storage of user data either being written to or read from the memory chips 11 and 13. Circuits 27 interface with the memory array chip(s) and circuits 29 interface with a host though connections 31. The integrity of data is in this example determined by calculating an ECC with circuits 33 dedicated to calculating the code. As user data is being transferred from the host to the flash memory array for storage, the circuit calculates an ECC from the data and the code is stored in the memory. When that user data are later read from the memory, they are again passed through the circuit 33 which calculates the ECC by the same algorithm and compares that code with the one calculated and stored with the data. If they compare, the integrity of the data is confirmed. If they differ, depending upon the specific ECC algorithm utilized, those bits in error, up to a number supported by the algorithm, can be identified and corrected.

The connections 31 memory of FIG. 1A mate with connections 31' of a host system, an example of which is given in FIG. 1B. Data transfers between the host and the memory of FIG. 1A through interface circuits 35. A typical host also includes a microprocessor 37, a ROM 39 for storing firmware code and RAM 41. Other circuits and subsystems 43 often include a high capacity magnetic data storage disk drive, interface circuits for a keyboard, a monitor and the like, depending upon the particular host system. Some examples of such hosts include desktop computers, laptop computers, handheld computers, palmtop computers, personal digital assistants (PDAs), MP3 and other audio players, digital cameras, video cameras, electronic game machines, wireless and wired telephony devices, answering machines, voice recorders, network routers and others.

The memory of FIG. 1A may be implemented as a small enclosed card containing the controller and all its memory array circuit devices in a form that is removably connectable with the host of FIG. 1B. That is, mating connections 31 and 31' allow a card to be disconnected and moved to another host, or replaced by connecting another card to the host. Alternatively, the memory array devices may be enclosed in a separate card that is electrically and mechanically connectable with a card containing the controller and connections 31. As a further alternative, the memory of FIG. 1A may be embedded within the host of FIG. 1B, wherein the connections 31 and 31' are permanently made. In this case, the memory is usually contained within an enclosure of the host along with other components.

Certain terms used in this description can benefit from some explanation. A "sector" refers to independently addressable units of data accessed during host read and write operations. One sector of data is typically 512 bytes in size.

The "memory system" as used herein is a system consisting of one or more non-volatile memory devices and the hardware and/or software required to store and retrieve data to and from the memory. Varying portions of the overall memory system functionality may be implemented either on a subsystem completely dedicated to data storage, or on the host system itself. The memory system may be embedded in a host system or may be removable, such as in the form of a very small card. Portions of a removable memory system may themselves be removable, as for example if the storage media is removable from the controller portion. Any portion of a host system dedicated specifically to data storage in a memory system is also considered a part of the memory system. Such host functionality may include specialized software libraries, drivers, or applications in addition to any hardware residing on the host system.

For the purposes used herein, a "host system" is a system that generally has a functionality other than data storage, but which also either connects to the memory system, or has a memory system embedded in it. There can be host systems whose sole purpose is data storage.

The various techniques for refreshing and scrubbing data stored in flash memory described herein may be implemented in systems having various specific configurations, examples of which are given in FIGS. 2–6. FIG. 2 illustrates a portion of a memory array wherein memory cells are grouped into blocks, the cells in each block being erasable together as part of a single erase operation, usually simultaneously. The physical block is the minimum unit of erase.

The size of the individual memory cell blocks of FIG. 2 can vary but one commercially practiced form includes a single sector of data in an individual block. The contents of such a data sector is illustrated in FIG. 3. User data 51 are typically 512 bytes. In addition to the user data 51 is overhead data that includes an ECC 53 calculated from the user data, parameters 55 relating to the sector data and/or the block in which the sector is programmed and an ECC 57 calculated from the parameters 55 and any other overhead data that might be included. The parameters 55 may include a quantity related to the number of program/erase cycles experienced by the block ("hot counts"), this quantity being updated after each cycle or a preset number of cycles. One use of this experience quantity is to regularly re-map logical block addresses to different physical block addresses in order to even the usage (wear leveling) of all the blocks. Another use of the experience quantity is to change voltages and other parameters of programming, reading and/or erasing as a function of the number of cycles experienced by different sectors. Additional uses of experience quantities in the process of identifying blocks to be scrubbed are described below.

The parameters 55 may also include an indication of the bit values assigned to each of the storage states of the memory cells, commonly referred to as their "rotation". That is, logical states of the data are mapped to different physical storage states. This also has a beneficial effect in wear leveling. One or more flags may also be included in the, parameters 55 that indicate status or states. Indications of voltage levels to be used for programming and/or erasing the block can also be stored within the parameters 55, these voltages being updated as the number of cycles experienced by the block and other factors change. Other examples of the overhead parameters 55 include an identification of any defective cells within the block, the logical address of the data block that is mapped into this physical block and the address of any substitute physical block in case the primary block is defective. The particular combination of parameters 55 that are used in any memory system will vary in accordance with the design. Also, some or all of the overhead data can be stored in physical blocks dedicated to such a function, rather than in the block containing the user data or to which the overhead data relates.

Different from the single data sector block of FIG. 2 is a multi-sector physical block of FIG. 4. An example block 59, still the minimum unit of erase, contains four pages 0–3, each of which is the minimum unit of programming. One or more host sectors of data are stored in each page, usually along with overhead data including at least the ECC calculated from the sector's data and may be in the form of the data sector of FIG. 3. When data of less than all the pages are updated, the updated data are typically stored in a page of an erased block from an erased block pool and data in the remaining unchanged pages are copied from the original block into the new block. The original block is then erased. Variations of this large block management technique include writing the updated data into a page of another block without moving data from the original block or erasing it. This results in multiple pages having the same logical address. The most recent page of data is identified by some convenient technique such as the time of programming that is recorded as a field in sector or page overhead data.

A further multi-sector physical block arrangement is illustrated in FIG. 5. Here, the total memory cell array is physically divided into two or more planes, four planes 0–3 being illustrated. Each plane is a sub-array of memory cells that has its own data registers, sense amplifiers, addressing decoders and the like in order to be able to operate largely independently of the other planes. All the planes may be provided on a single integrated circuit device or on multiple devices, an example being to form each plane from one or more distinct integrated circuit devices. Each block in the system of FIG. 5 contains 16 pages P0–P15, each page having a capacity of one, two or more host data sectors and some overhead data.

Yet another memory cell arrangement is illustrated in FIG. 6. Each physical plane contains a large number of blocks of cells. In order to increase the degree of parallelism of operation, blocks within different planes are logically linked to form metablocks. One such metablock is illustrated in FIG. 6 as being formed of block 3 of plane 0, block 1 of plane 1, block 1 of plane 2 and block 2 of plane 3. Each metablock is logically addressable and the memory controller assigns and keeps track of the blocks that form the individual metablocks. The host system preferably interfaces with the memory system in units of data equal to the capacity of the individual metablocks. Such a logical data block 61 of FIG. 6, for example, is identified by a logical block addresses (LBA) that is mapped by the controller into the physical block numbers (PBNs) of the blocks that make up the metablock. All blocks of the metablock are erased together, and pages from each block are preferably programmed and read simultaneously.

There are many different memory array architectures, configurations and specific cell structures that may be employed to implement the memories described above with respect to FIGS. 2–6. One block of a memory array of the NAND type is shown in FIG. 7 in order to illustrate a few of the disturb mechanisms. A large number of column oriented strings of series connected memory cells are connected between a common source 65 of a voltage VSS and one of bit lines BL0–BLN that are in turn connected with circuits 67 containing address decoders, drivers, read sense amplifiers and the like. Specifically, one such string contains charge storage transistors 70, 71 . . . 72 and 74 connected in series between select transistors 77 and 79 at opposite ends of the strings. In this example, each string contains 16 storage transistors but other numbers are possible. Word lines WL0–WL15 extend across one storage transistor of each string and are connected to circuits 81 that contain address decoders and voltage source drivers of the word lines. Voltages on lines 83 and 84 control connection of all the strings in the block together to either the voltage source 65 and/or the bit lines BL0–BLN through their select transistors. Data and addresses come from the memory controller.

Each row of charge storage transistors (memory cells) of the block forms a page that is programmed and read together. An appropriate voltage is applied to the word line (WL) of such a page for programming or reading its data while voltages applied to the remaining word lines are selected to render their respective storage transistors conductive. In the course of programming or reading one row (page) of storage transistors, previously stored charge levels on unselected rows can be disturbed because of voltages applied across all the strings and to their word lines.

Various Aspects of the Scrub Process

There are two primary phases of scrub, the read phase and the corrective action phase. The scrub read is distinguished from other system reads in that it generally involves the selection and reading of data in areas of the memory system not directly related to the completion of a particular host operation, nor to any of a number of other system operations, such as wear leveling. Another distinguishing feature of the scrub read is that no useful information is gathered by the system from the data read, but instead, the result of the data integrity check is the objective of the operation. Subsequent action on the part of the system is guided by the result of the integrity check, and not particularly by the data itself. The system may subsequently require the use of some information from the data read, such as overhead data, if the data fails the integrity check and corrective action is required. These features of not completing a particular host operation and not obtaining any useful data from the memory are fundamental differences between scrub reads and other data reads performed by the system.

The selection of the particular areas to scrub read is generally guided by the location and number of read, write and erase operations performed in the normal course of system operation in the context of the physical characteristics of the memory device. Generally, the scrub reads will be performed on areas of the memory array that have been exposed to voltages, currents or cross talk as a result of operations in other areas. Alternatively, the scrub read locations may be decoupled from other memory operations, and made to follow a deterministic or random sequence. However, this can result in a loss of system performance, as more reads would have to be performed to get the same amount of coverage of the more disturbed areas.

An additional aspect of the scrub reads is the selection of when to perform the scrub read operation. In general, the scrub operation can be initiated in response to any number of factors, such as a number of host operations, a number of physical read, write and/or erase operations, a time period, usage characteristics of the host, or some random or pseudo-random sequence, the generating and checking of which may be tied to any of the above.

The scrub write is distinguished from other system writes in that it is performed generally as a result of a failed integrity check of the data read during a scrub read. A scrub write is only unique in the context of the scrub read. Other write operations may be performed that have similar mechanisms to scrub writes but which are not carried out for that specific purpose. In one example, write operations may result from failed integrity checks after read or write operations performed in the course of normal memory system operation. In another example, data may be read and rewritten for refresh purposes in the absence of scrub reads, with the decision to write not based on the data integrity check, but instead on some other factor. One such factor can be the existence of an area of the array having high use or exposure, in which case data within the area may be re-written or moved. A continuous moving or refreshing of data may be done in a deterministic or random manner. Data may be read and rewritten with the intended purpose of wear leveling, but have an unintended benefit of refreshing the data in a manner that overcomes disturb issues.

Indeed, the relative freshness of a unit of data can be used to determine whether to initiate scrub of that data unit when it meets other criteria for doing so. That is, if a unit of data has recently been re-programmed as part of a wear leveling, data consolidation (garbage collection), prior scrub or other operation, the current scrub can be skipped since those data have recently been refreshed. The relative freshness of various units of data may be maintained, for example, with experience counts ("hot counts") or time stamps stored with the units of data, such as in part of overhead data of the blocks. Alternatively, the physical blocks may be grouped according to the freshness of the data stored in them, with the group to which a block belongs being stored as overhead data of the block. The relative freshness of blocks which otherwise become candidates for scrub can then be used as a factor in selecting those that are actually scrubbed. System performance is then improved by limiting scrub operations to those units of data that have been stored long enough so that their stored charge levels have likely been disturbed sufficiently to require attention.

In order to monitor the relative freshness of the stored data, either logical or physical blocks may effectively be grouped into sets based upon how recently the blocks have been re-programmed. All blocks within the entire memory array, or, alternatively, blocks within a plane, zone or other portion of the array, may be given an initial relative hot count value, and each time a block is reprogrammed, the relative hot count may be updated to the value of the most recently moved set or group. Once a certain number of blocks are in the most recently reprogrammed group, the most recently reprogrammed group value may be incremented, and any blocks subsequently reprogrammed may be updated to the new group value. As a result, distinct groups may be created with a relatively clear distinction between most recently reprogrammed and least recently reprogrammed blocks. In general, the relative hot count value of a block is allowed to roll over to permit the use of a relatively small number fields.

When relative hot counts are utilized, substantially all blocks may start at a base value of '0' when there are eight possible values, in a specific example, e.g., values of '0' through '7.' Seven out of the eight values may be used while one value is reserved to provide a gap between the value representing the blocks most recently programmed from the value identifying the blocks containing the oldest data. In this example, blocks that are written receive a new value of '1' to indicate that they are the most recently programmed. Once a certain number of blocks have been updated to the new value of '1,' blocks subsequently programmed may receive a new value of '2.' A value of '3' may eventually be assigned to newly reprogrammed blocks once a certain number of blocks have been assigned the value of '2.' At some point, the count will roll over such that the least recently used blocks have a value of '2,' the most recently programmed blocks have a value of '0' and the value '1' provides a gap between the two so that the values of the blocks with the oldest and newest data are clearly identified. Eventually, all the blocks in the oldest bin will be rewritten, either through a host write, scrubbing, wear-leveling or other mechanism. In the above example, bin '2' will then be empty, and that value can serve as the gap, while bin '1' can be used to identify the most recently written blocks. When a block becomes a candidate for a scrubbing operation on the basis of other criteria, its scrubbing may be skipped if its relative hot count places it in one of the groups of blocks more recently reprogrammed.

Alternatively, absolute hot counts may be maintained for either or both logical and physical blocks, in which case the system may preferably use such hot counts to make scrub decisions. That is, when a block is reprogrammed, its absolute hot count is incremented, decremented or otherwise maintained to provide an indication of the total number of times the block has been reprogrammed. Blocks with absolute hot counts indicating a large number of reprogramming operations typically have been reprogrammed more recently than blocks with absolute hot counts indicating a low number of reprogramming operations. Thus, scrubbing the data stored in blocks with a relatively high number of reprogramming operations may be skipped, since it is unlikely that the data has been significantly disturbed.

There are many specific scrubbing algorithms and related memory operations that may alternately be performed. Scrubbing may be controlled by the memory system controller or, alternatively, on each of the memory cell integrated circuit devices (chips), or even controlled in part or entirely by the host. The memory system may be removeably connectable with the host or, alternatively, can be embedded within the host.

The read phase of a scrub operation may be carried out in a number of different ways. Scrub rates may be tuned to optimize performance while maintaining a specified level of data integrity. Both the rates at which scrub operations are performed and the number of data sectors read at a time may be tuned, for example. Such tuning can take place automatically as part of the scrub algorithm. For instance, the rates and locations of scrubbing may be matched with uneven disturb exposure rates in different areas of the memory. Scrub reads may also be deferred in order to optimize system performance, or to meet specific real-time needs.

There are also various alternatives in the manner in which the scrub read is carried out. For example, a set of data may be read with both nominal reference levels and with margined reference levels. The amount of margin may target specific disturb mechanisms being encountered. If read data cannot be corrected by ECC, for example, then a read with wider margins may be able to recover the data. If data are read normally without any errors, then a read with narrower margins can provide information of the quality of the data.

After a scrub read, a decision is made whether to engage in corrective action. Among factors that are such a decision may be based upon include a level of activity based on a number and/or a pattern of bits in error that have been detected.

Corrective action most commonly includes re-writing the read data in the same or a different location in the memory. Such scrub writes may be deferred in order to optimize system performance, or to meet specific real-time needs. Corrective action can additionally include rotation of the data during a scrub write operation; that is, the memory cell states representing specific stored data is changed from what it was. Corrective action can also include mapping cells, columns or other structures deemed to be susceptible to disturb out of the system.

A majority of host protocols have an abstract interface to the memory system such that the memory is generally addressed by the host by logical block address number (LBA). Alternate equivalent addressing modes exist, such as cylinder-head-sector in the ATA host protocol, but the fundamental concept is that the host has no knowledge of the physical location at which the memory system has stored a given host data sector. The host system has available to it a linearly contiguous set of independently logical block addresses at which to store and retrieve data sectors. These abstracted host protocols generally require the presence of a controller on the memory system in order to control the memory operations, perform the mapping functionality, data management, error recovery, and so on. Memory systems operating with these abstracted host protocols preferably rely on the controller in the memory system to perform scrub operations, as the host generally has no knowledge of the physical aspects of the Memory System.

On the other hand, some host protocols have an interface in which the host itself performs the memory management functions. Memory systems that conform to these protocols typically have minimal controller functionality, if any at all. There may be varying portions of functionality such as, but not limited to ECC generation, ECC checking, or ECC correction, that may be performed by the Memory System rather than the Host System. Memory systems operating in these host memory managed protocols will usually rely on the host to perform the scrub operations, since the memory system typically has insufficient logic to perform scrub operations.

Some memory systems have a dedicated controller whose purpose is to operate the memory device and perform memory management functionality. Other memory systems do not have dedicated memory controllers, but instead rely on portions of the host infrastructure to perform memory management operations. As an example, a non-volatile memory device may be connected directly to a general-purpose microprocessor in the host system, with the memory management functionality being performed by software. In such memory systems without controllers, the same subsystem responsible for memory management operations also preferably performs the scrub functionality.

Of the memory systems that do have a controller, it is possible that the controller functionality is integrated into a non-volatile memory device (integrated circuit chip) itself. In an extreme example, the entire controller may be integrated on a memory device.

The memory system may be embedded in the host system and to varying degrees have functionality integrated into host subsystems that are general purpose or that have other functionality. In such embedded memory systems, the same host protocols are generally followed, though that may not necessarily be the case. As a general rule, however, the same set of functionality is required to operate the memory system.

While the memory system typically performs scrub operations in the case of an abstracted host protocol, it is possible that the host system can initiate scrub operations in such systems through use of a special command or other predefined interface transaction. One reason for implementing this functionality may be that the host system is most aware of periods of time during which the memory system will not be accessed to store or retrieve data, and the host system may take the opportunity to initiate a scrub operation during such periods of time. In this way, the overall reliability of the system may be increased with minimal impact upon performance. The mechanism used to initiate a scrub operation may be specifically for the purpose of scrub, or it may be a general-purpose mechanism for notifying the memory system that time is available for housekeeping operations. In the latter case, scrub operations may be one of several operations performed by the memory system during such periods of time.

The region of exposure due to a given memory operation is generally extensive, such that it is not practical to scrub the entire exposed region every time an operation is performed. Generally, only a portion of the exposed area will be selected for scrub, and the rate of scrub must be set such that the scrub operation will detect the most disturbed areas before the number of bits in error and the level of shifted cells exceeds any recovery schemes available on the memory system.

The rate at which scrub operations are performed is an important parameter affecting both data integrity and memory system performance. The higher the rate of scrub, the higher the likelihood of detecting disturbed cells in a block of data before the number of bits in error and the level of shifted cells exceeds any recovery schemes available on the memory system. However, the higher scrub rate, the greater the degradation in performance of the memory system as increasing amounts of memory and controller time are dedicated to this operation. To the end of guaranteeing a desired level of data integrity while sacrificing as little performance as possible, the scrub rate is optimized to the bare minimum required, with whatever guard band is deemed appropriate. The rate at which scrub operations may be performed may vary in two ways: 1) selection of the time at which to perform a scrub operation, and 2) selection of a number of sectors to scrub read at a time.

It is possible that the rate of scrub required for maintaining data integrity changes over the lifetime of the product. For example, as cells become more cycled, the rate of disturb may increase or decrease. If a fixed rate of scrub were set at the time of production, then in order to maintain memory system integrity over the lifetime of the memory system, the highest rate required over the lifetime of the memory system would have to be used. This would result in a higher rate of scrub when a lower one would suffice, resulting in a higher sacrifice of memory system performance than needed at certain times in the memory system lifetime. There are several approaches to tuning scrub rates over the lifetime of a memory system.

It is possible to set a variable rate of scrub at the time of manufacturing the memory system. One method of doing so is to provide a table of rate values that sets different scrub rate with whatever metric affects disturb rate. An example is a table that contains scrub rates for different program/erase cycle counts experienced by various portions of the memory array. If the memory system maintains cycle counts, then the scrub rate parameter would be selected from the table based on the worst-case or average cycle count of a given region of the array.

Another approach is to allow the memory system to self-adjust the rate of scrub based on the results of previous scrub operations. For example, if the memory system maintains a log of scrub operations and determines that a very low percentage of scrub operations require corrective action, it may adjust down the rate at which it performs scrub reads. On the other hand, if it is determined that a very high percentage of scrub operations require corrective action, it may adjust down the rate at which it performs scrub reads. Another metric by which the memory system may adjust the scrub rate is the amount of shift detected in individual storage elements during previous scrub operations, or the number of bits in error. In any of the above cases, the system may adjust scrub rate parameters adaptively with each new result, or it may log the information for periodic adjustment.

There are several techniques that may be used to select when to perform a scrub operation, some examples of which are: 1) random or pseudo-random, 2) based on number of host operations, 3) based on number of operations on the memory device, 4) based on a time interval. It is possible using any of the above described methods to tune the rate at which scrub operations are performed. The assumption below is that any parameters required for the scrub decision are provided at production time. There may be different rate parameters for read, write and erase operations, as each of these may disturb the memory at different rates.

It is possible to use random numbers (RN) or pseudo-random numbers (PRN) to determine the frequency of scrub operations if they are available to the system, or generated by the system. A number of methods are described below for using an RN or PRN sequence to decide whether or not to perform a scrub operation. All of the below methods assume the RN is being checked at some regular interval, and the decision to perform the scrub or not is based on some test of the RN value.

One method of using a random number to determine scrub rate is to perform a logical AND of a RN or PRN with a mask parameter containing some number of bits set to value one, and the remainder set to zero. The decision to perform a scrub or not would be based on whether the AND operation resulted in a zero or a non-zero value. A mask parameter with more ones results in a zero value less frequently than a mask value with more zeros. The table below shows the approximate rates of scrub with different eight-bit mask values, assuming that a zero AND result causes a scrub operation. Note that with a truly random sequence, only the number of bits with value of one affects the rate, and not the value itself, so the values in the table are only exemplary values.

| Mask Value (hex) | Mask Value (bin) | Scrub Rate |
| --- | --- | --- |
| 0x00 | 00000000 | $1/1$ |
| 0x01 | 00000001 | $1/2$ |
| 0x03 | 00000011 | $1/4$ |
| 0x07 | 00000111 | $1/8$ |
| 0x0F | 00001111 | $1/16$ |
| 0x1F | 00011111 | $1/32$ |
| 0x3F | 00111111 | $1/64$ |
| 0x7F | 01111111 | $1/128$ |
| 0xFF | 11111111 | $1/256$ |

Another related method is to count the number of bits in an RN of value 1 to determine whether or not to perform a scrub operation. Again, the number of bits in the RN might be compared with a mask or value indicating a threshold. Yet another method entails comparing the value of an RN with that of a scrub rate parameter. The decision to perform a scrub or not would be based on whether the RN exceeded the threshold value numerically. For example, for a threshold value of 5, the RN would be higher $5/256$ of the time.

Alternatively, the rate of scrub may be tied to the number of host operations performed. For example, a scrub operation may be performed every N host read, write and/or erase operations, where N is a rate parameter that sets the rate of scrub. Further, the rate of scrub may be tied to the number of memory operations performed. For example, a scrub operation may be performed every NR reads, NW write and/or NE erase operations, where NR, NW and NE are rate parameters that set the rate of scrub. As a further alternative, where the memory system includes a method of measuring time intervals, then the scrubs may be performed at some regular time interval, T, where T is a parameter provided to set the rate of scrub.

It may be desirable in order to maintain performance of the memory system to defer a scrub read even after the decision to perform a scrub read has been made. The reasons for doing so may include real-time considerations. For example a host may require a certain data transfer, and dedicating resources to scrub at certain times might impact the ability of the memory system to meet the guaranteed data rate. For such a purpose, the memory system may queue the scrub operation parameters for later processing, at a time when performing the scrub would not impact performance to the host. The scrub operations may be deferred until sometime later in the host command processing, sometime after the command processing, or until a later host command. In such a case, the scrub operation parameters that have been decided upon are stored and processed at a later time when it is most convenient to the host.

Since only a portion of an exposed region of the memory array may be scrubbed at a given time, one important aspect of achieving proper coverage is the selection of where to scrub once the decision to perform a scrub has been made. The selection of where to scrub is generally related to the location of read, write and/or erase operations to the memory device. Embedded in the selection is knowledge of the region over which a given memory operation will disturb other storage elements. Relating the area to scrub to the area operated upon allows the scrub operations to be most efficient, in that scrub operations are not performed on areas of the memory that have not likely been disturbed.

One method of selecting the location to scrub entails using an RN or PRN to select a location from within the area of exposure of a given operation. On average, the areas experiencing most exposure will have the most opportunities to be selected for scrub. The rate of scrub would be adjusted to account for the expected worst case random number coverage, given that some areas will be selected more often than others, and only on average will there be even coverage.

Another method of selecting the location to scrub entails moving deterministically through an exposed region. However, this method would require logging of both memory operations and of scrub operations to ensure full coverage.

If activity to the memory is logged, then it is possible to get a measure of the amount of exposure a given area receives to potentially disturbing operations. Given such information, the memory system can search through the log for the areas that have received the highest exposure, and limit the scrub operation to those areas. This method may be used to guide any of the above methods in determining rate and locations to scrub. Generally the program/erase cycles may be tracked through maintenance of cycle count information. However, it is generally impractical to log read activity, so this method is likely not be used to track read exposure.

Alternatively, the locations of corrective actions may be logged and used as a guide to areas that may be more susceptible to disturb than others, or which receive greater exposure than others. The memory system may use this information to weight the choice of areas to scrub, particularly for areas that have required corrective action more frequently than others.

In systems where knowledge of potential regions of disturb exposure is not maintained, either of the random or deterministic methods may be used independent of such knowledge. In this case, the scrubs are performed throughout the memory system regardless of where host activity causes operations in the memory system to occur. However, the rate of scrub is adjusted high enough to ensure sufficient coverage. Generally this is a large waste of resources since some areas of the memory system will experience much more exposure than others, and are preferably the primary areas of focus of scrub operations.

The purpose of a scrub operation is to detect disturbed storage elements before the number of bits in error and the level of shifted cells exceed any recovery schemes available on the memory system. To this end, it is generally desirable to detect disturb as early as possible and before much of the guard band for a given voltage threshold level has been lost to disturb.

As described above in the background, flash memories usually store data at discrete states, or ranges of charge storage levels, each of which is separated from other states by some guard band. There is generally a nominal sensing level of discrimination between each state above which a storage element is deemed to be in one state, and below which it is deemed to be in another state. As a given storage element is disturbed, the level to which it has been programmed or erased may begin to shift. If the level of the storage element approaches the sensing level of discrimination, or crosses over it, it produces data in a state different that that to which it was programmed or erased. The error will generally manifest itself as one or more bits in error in the data, and will generally be detected through the use of ECC covering the data field.

Margining or biasing the read conditions such that the sensing level of discrimination is shifted more toward one state or another will cause disturbed storage elements to be sensed in the wrong state even if the amount of shift would not cause an error under nominal read conditions. This allows the system to detect shift before it approaches the point at which it would cause errors during normal memory system operation.

If disturb mechanisms are known to affect data storage levels in a specific way, it is possible to target detection of those specific disturb mechanisms by margining read conditions toward the expected level shifts. While the ideal situation would be to target the expected disturb mechanisms with a single read operation under a single set of margin conditions, this may not usually be possible. It may be necessary to perform multiple read operations under different conditions. For example, it is possible that different disturb mechanisms present in a memory cause storage elements to become either more programmed or more erased. Storage elements both above and below a discrimination level may be shift toward it, in which case it may be necessary to check first for a shift in the storage levels toward a discrimination level from one state, and then from the other.

There are two individual measures of data quality that can be used as thresholds to determine if corrective action should be taken: 1) the detection of data errors through use of ECC, and 2) even though few or no data errors are detected, a shift in the charge storage levels can be detected before they cause data read errors.

As discussed above, the scrub read conditions may be margined in order to target certain expected disturb mechanisms, or to simply check for sufficient margin in the stored levels. Whether the data was read under nominal or margined conditions, the decision whether or not to take corrective action may be based on the number of bits in error detected during the scrub read operation. For example, if the number of bits in error are below the ECC correction capabilities of the system, the system may decide to defer the corrective action, or to ignore the error altogether.

In addition to using the number of bits in error as a threshold to initiating corrective action, the system may make the decision to correct based on other factors such as the pattern of bits in error. For example, the ECC correction capabilities may be sensitive to bit error pattern, or bit error patterns may be indicative of a particular known disturb mechanism in the nonvolatile memory. There may be other reasons for basing the threshold on bit error patterns. The bit error pattern is generally revealed during the ECC correction operation.

It may be desirable for performance purposes to defer a scrub corrective action even if it has been determined that corrective action is required. The reasons for doing so may include real-time considerations. For example a host may require a certain data transfer, and dedicating resources to scrub corrective action at certain times might impact the ability of the memory system to meet the guaranteed data rate. For such a purpose, the memory system may queue the scrub corrective action operation parameters for later processing, at a time when performing the scrub corrective action would not impact performance to the host. The scrub corrective action operations may be deferred until sometime later in the host command processing, sometime after the command processing, or until a later host command. The main point is that the scrub operation parameters would be stored and processed at a later time when it is most convenient to the host.

There are two significantly distinct extremes of memory architectures, each of which leads to different methods of mapping host data to physical locations on the memory device and of managing and accessing data once programmed. The fundamental difference between the two architectures relates to the size of the minimum unit of erase and its relation to the size of the host protocol data sector.

If the size of the minimum unit of erase approximates that of the host data sector, then it is possible to implement a direct addressing scheme, in which a given host data sector is generally mapped to the same physical location as it written to by the host. In such a scheme, the previous contents are generally erased from the physical location prior to the superceding data being written in its place. This rewriting may entail read-modify-write if the size of the minimum unit of erase is larger than that of a host sector. It is possible in this addressing scheme for host sectors to be remapped to alternate locations within the storage system, but this generally only occurs during sector reassignments as part of a defect management operation, or for some other system reliability purpose. After such mapping, the host sector will generally remain mapped to the new physical location until some other reassign event. In such a direct address mapping scheme, the corrective action due to a disturb generally entails erasing the contents from the physical location determined to have been disturbed, and rewriting them to the same location. Any errors during the rewrite would be handled in a manner consistent with the general exception handling employed by the system, including, but not limited to, re-erase and rewrite, reassign, alteration of erase or write parameters, and so on.

On the other hand, if the size of the minimum unit of erase is much larger than that of host sectors, then it is common to implement an erase-pooling addressing scheme. Such an addressing scheme can also be implemented with memories having a small minimum unit of erase as well. In an erase-pooling scheme, host sectors are normally grouped into logical blocks that are then mapped into physical units of erase. A given host data sector is surrounded by other host data sectors within a unit of erase. When the host writes a given data sector, it would be impractical to read all sectors surrounding the target sector, erase the block, and then write all sectors back to the unit of erase with the one host sector containing the new data. To avoid such excessive overhead operations, an erase-pooling scheme generally maintains some number of units of erase in the erased state for the purpose of holding new versions of data as they are written. Sectors are generally grouped together into logical groups for data management purposes, and in general the system will attempt to maintain physical proximity of sectors in the same logical group. Several units of erase may be combined to form a logical construct called a metablock, or virtual block, normally for the purposes of allowing high write parallelism. Generally, the new data from the host will be written to an erased location. At some point, other sectors from the same logical group that have not been superceded with new data are either copied into the same metablock, or copied along with the newly written data into another metablock. Later, once all data in a given metablock or in a unit of erase has been superceded or copied elsewhere, the metablock or unit of erase will be erased and will be considered part of the pool of erased units of erase. In such an erase-pooling addressing scheme, the corrective action due to a disturb generally entails copying the affected data to another location on the memory system, along with any data consolidation required by the system for normal memory system behavior.

However, it is possible for data requiring corrective action during a scrub operation to be treated differently than write operations due to host activity or general data management. It is possible to write the data to a special location reserved for holding such data for a short amount of time until it is convenient for the system to consolidate them with logically contiguous data, said area either held in reserve, or allocated upon demand. It is also possible under some circumstances that the system would simply erase and re-write the data to the same location. For example, if little or no other data resides in the physical block, the other data could either be moved elsewhere permanently, or stored temporarily elsewhere during erase, possibly in volatile memory, and written back along with the data requiring corrective action. Any errors during the data write would be handled in a manner consistent with the general exception handling employed by the system, including, but not limited to, rewrite, reassign, write to a new location, alteration of erase or write parameters, forced rotation of data polarity, and so on.

Some individual storage elements, groups of storage elements, or other structures may be more susceptible than others to disturb. As an example of possible such structures or groupings, flash memory storage elements may be arranged to share a common drain, source, or gate line, and due to variance in the process it is possible that one such set of connected storage elements experience a stronger exposure to potentially disturbing signals than average. Likewise, individual storage elements may be more susceptible than others due to variance in the process used to form the array. The storage system may be designed to permanently map out or reassign these areas deemed to be susceptible to disturb. In an extreme case, any storage elements or other structures may be remapped upon the first occurrence of a scrub corrective action. For example, those storage elements containing the bits requiring ECC correction may be mapped out if redundant storage elements are available. In other embodiments, the locations of corrective actions may be logged and later analyzed for purposes of re-mapping storage elements or groupings at a later time. The analysis may involve a threshold of number of times a given grouping has required corrective action. In some cases the logged data may need to be analyzed with knowledge of the physical aspects of the memory device in order to detect the presence of expected physical structures, such as connected storage elements. The manner in which storage elements or groupings of storage elements are re-mapped depend on the implementation of the memory system. For example, a physical area containing a logical sector may contain redundant storage elements for the purpose of replacing storage elements that are mapped out. In another example, an entire sector or group of sectors may be mapped out if it has required corrective action.

Scrub operations may be performed in the background of host operations, or in between host operations. It may be desirable to change the behavior of the scrub operation depending on the type of operation the host has requested. For example, it may not be convenient for scrub corrective action to take place during execution of a host read command, in which case the corrective action may be deferred to a time which is more convenient to the memory system.

An alternate approach to disturb avoidance is to move data that has received potentially disturbing exposure without first checking to determine if the data are in error. There are many approaches to selecting the frequency and location of data to move, most of which are described above.

General Embodiment of Scrub

A flow chart of FIG. 8 outlines the major steps in an example flash memory scrub algorithm. A first step 91 monitors activity of the memory system to determine when a trigger event for a scrub operation has occurred. Such a trigger event can be one or more of the following:

1. When a data read, data write or erase operation occurs within a given block or other unit of the array that may disturb the charge levels-of other units. The intensity and/or duration of the operation may be important in determining whether to trigger a scrub operation, as well as the susceptibility of the array to disturbs (such as when the memory is operating in multi-state with narrow charge level ranges defining the individual states).
2. When a normal system read operation of a given unit reads data with at least one or pre-set number of bit errors.
3. When margin reads (with reference levels set to read a narrower programmed distribution than the normal read) show that the threshold levels of the programmed cells, although no bit errors exist, are not optimal.
4. After a predefined interval of time has passed since the last scrub operation.
5. When the host initiates a scrubbing operation.

The overall goal is to institute a scrub operation often enough to detect disturbed data before they become so numerous as to exceed any recovery schemes (ECC and the like) that may be available in the memory system.

Once a scrub trigger event is detected, a next step 93 determines locations within the memory array for performing a scrub operation. Example candidates can be determined as follows:

1. Blocks or other unit(s) outside the given unit that share bit lines, word lines or other signal lines with the given unit, on which voltages or currents are applied during the read, write or erase operation.
2. Other unit(s) outside the given unit that have signal lines field coupled with those of the given unit such that cross-talk exists between them.
3. Whether such other unit(s) are programmed or erased may determine whether they are potentially affected by the operation on the given unit.
4. The unit(s) potentially affected may be depend upon whether the operation is read, write or erase.
5. If triggered by a normal system read of the given unit that discovers error(s) in the read data, the given unit is identified for a scrub operation.
6. The relative freshness of the data in candidate blocks may be used to eliminate those that have more recently been re-written.

The identification of memory block(s) or other unit(s) as candidates for scrub is not necessarily followed by the scrub being performed. As indicated by a next step 95, initiation of the scrub operation can be deferred under certain circumstances, examples of which are:

1. Scrub reads may be deferred in order to optimize system performance or to meet specific real-time operating needs of the memory system.

2. Self-tuning scrub: The rate at which scrub operations are performed may be dynamically adjusted to optimally balance maintaining performance and data integrity.
3. The urgency of performing a scrub operation may be determined in part from characteristics of the units that are identified as potentially affected, such as their experience level (the number of programming/erasing cycles), and the type of event that caused the scrub operation to be triggered.
4. A scrub trigger event may further be limited to occur in a deterministic, random or pseudorandom manner:
   (a) After a specified number of host operations;
   (b) After a specified number of physical read, write and/or erase operations;
   (c) After a specified time period;
   (d) Based upon usage characteristics of the host; or
   (e) A random or pseudo-random sequence, the generation and checking of which may be tied to any of the above.

In a next step 97, all or only some of the block(s) or other unit(s) of memory identified in step 93 as candidates for scrub are selected for the scrub operation. The selection criteria include:
1. The number of determined units that will be identified for scrubbing in any one operation may be selected to balance the effect of the time taken for scrub upon system performance and the need to maintain data integrity.
2. The manner in which this balance is maintained can be to identify a number of units for the current scrubbing operation that depend upon the age of the memory, the number of program/erase cycles experienced by the identified units, the type of event that has triggered the scrub operation and a history of corrective action necessarily taken on data in the identified units.
3. The number of units included in a scrub operation can depend upon the age of the memory, the number of program/erase cycles experienced by the given units, and the type of event that has triggered the scrub operation.
4. Alternatively, less than all the identified units may be selected for scrubbing by following a deterministic, random or pseudo-random sequence in a manner unrelated to normal usage.

Next, as indicated by a step 99, data are read from the selected units (scrub read) according to the following:
1. A scrub read is not directly related to the completion of any particular host operation, or to other system operations, such as wear leveling, but is usually executed in the same manner as normal data reads.
2. Margin reads (reads with reference levels different from those of normal data reads) may be performed in specific circumstances:
   (a) As a second read of data that have too many errors to be corrected by ECC, where the reference levels in the second read are relaxed to read a wider programmed distribution than the normal read (or may alternatively be carried out in the data correction step 107 discussed below); or
   (b) When the specific disturb mechanism expected to be caused by the triggering event likely shifts the programmed levels significantly, the initial read could be a margin read with wider reference levels; or
   (c) As a second read of data that have none or a few bit errors that are correctable by ECC in order to identify data stored as charge levels that have shifted away from optimum levels, where the reference levels of this second read are tightened to read a narrower distribution than the normal read. (Margin scrub reads are later discussed further with respect to FIG. 10.)
3. As part of reading the data of a block, the overhead data is also read. If the relative freshness of the data is stored in the header, then it can be used to identify freshly re-written blocks that do not need to be scrubbed.

A next step 101 evaluates the integrity of the read data. As part of the scrub read, an ECC may be calculated from the user data read from the memory unit(s) and compared with the ECC that was earlier calculated and stored along with the user data during programming. So long as there are no bit errors or a small number of errors that can be corrected by the ECC, the second margined read with relaxed reference levels, as described above, need not be made.

An additional read that may optionally be made is of the levels of tracking cells, if provided in the memory array, to see if their stored values have changed. Tracking memory cells are often included to establish the reference levels used to read the memory cells.

Once the data are read and the number of errors (if any) of the read data are known, a next step 103 determines whether corrective action is both necessary and desirable. Some considerations are as follows:
1. One approach is to correct the data having any number of bit errors, thus causing scrub to most significantly impact memory system performance.
2. Another approach is to forego correcting the data unless the number of data bit errors are in excess of some threshold N per unit read, thus reducing the impact of scrub on performance.
3. The pattern of erroneous data bits, as is determined by comparison of the ECCs, can also be used to determine whether correction of the data is desirable.
4. Data that was recently re-written (relatively high degree of freshness) are preferably not scrubbed.

Generally, the effect of completing the scrub operation on performance and the seriousness of the errors to present and future data integrity are preferably balanced when determining whether to correct the erroneous data.

In a next step 105, it is determined whether to perform the scrub corrective action or to defer it until a later time. One of the considerations in making this decision is the same as in step 95, namely deferral in order to meet specific real-time operating needs of the memory system at this time. Generally, completion of the scrub operation is preferably deferred if its later completion will cause a lesser impact upon system performance than to do so at the current time. It is usually undesirable to interrupt normal processing by the controller to perform a scrub, especially when the scrub operation will take more time than usual because of a large number of errors to be corrected by the ECC, the need to consolidate data, and the like. When deferred, the data read by the scrub read, their addresses, any errors determined by the ECC analysis and other parameters of the scrub operation developed in the preceding steps are temporarily stored. These data and parameters are then later read and the scrub operation is completed at a time when the impact on system performance is less.

When the scrub operation is to be completed, the data are corrected in a next step 107. The data are corrected by use of the ECC in this case. If not performed as part of step 99 above, one or more margin reads (where the reference levels are relaxed to read a wider programmed distribution than used during the prior read) may be required to recover data if a normal or scrub read produces more bits in error than can be corrected by the ECC being used. Then, in a step 109, appropriate corrective action is taken. This can include rewriting the corrected data in the same location from which they were read. This, of course, requires first erasing the block in which the data is rewritten, which may be practical in the memory arrangement of FIG. 2 where each corrected data sector fills a memory cell block. But this is not efficient to do in the large block memory arrangements of FIGS. 5 and 6 unless there are enough corrected data sectors that have been corrected that need to be rewritten with logically consecutive addresses to fill or nearly fill a block.

Alternatively, the corrected data can be rewritten into a different location from where it was read earlier in the scrub operation. When the memory arrangement utilizes large storage blocks like shown in FIGS. 5 and 6, the erase pool or other large block management techniques previously described may be employed when the data to be rewritten is less than the capacity of a block. It is not uncommon, for example, for data in only one or two pages to be corrected from a block containing 16, 32 or more pages. For such cases, a block may be dedicated in one or more planes of the array for temporary storage of the one or few pages of corrected data. The rewritten data is then combined with uncorrected data stored in pages of the original block when it is convenient to do so, such as during data consolidation (garbage collection) that is initiated by other factors during the normal operation of the memory. Alternatively, such consolidation may be initiated by this dedicated block becoming full or after a pre-set amount of time passes after the subject pages of data were written into the dedicated block, or as otherwise convenient to the system operation.

It may be convenient to utilize a common designated physical block or blocks to temporarily store scrub rewrites of data from pages of many other blocks, and then later consolidate data of the rewritten pages with the data from other pages of their original blocks. For example, scrub rewrites of pages from blocks 1 and 2 are temporarily stored in a temporary block 3. Later, the scrub rewrites of block 1 are copied from block 3 into an erased block 4, and remaining unchanged pages of block 1 are also copied into block 3 to consolidate the data mapped into physical block 1. The same is then done in another erased block 5, in which the scrub rewrite of block 2 stored in block 3 and the unchanged data pages from block 2 are consolidated.

In the system of FIG. 6 that utilizes metablocks, there can either be one such dedicated block in each plane to store rewritten data from other blocks in that plane, or a single dedicated block in the entire system into which corrected data from all pages in any plane are written. The specific operation that is chosen depends upon the number of pages in the individual blocks, the number of pages in the entire memory array and a forecast of the expected number and frequency of the pages whose data will be corrected by the scrub process. A memory array having a structure and/or an operation that makes it susceptible to disturbs will need more dedicated blocks than otherwise. If the scrub read reveals no data errors but the scrub operation is being performed in order to move shifted stored charge levels back to the middle of their state ranges, the read data are simply rewritten since no corrections are obviously necessary.

The manner in which some memory systems are used causes few disturbs. The scrub process is then carried out infrequently because there are few triggering events to be recognized. In addition, it is practical to permanently store the relatively small amount of rewritten data together in one or more designated physical blocks, regardless of the physical blocks in which the scrubbed data originally resided. In this case, pages of scrubbed data are not recombined into physical blocks with pages of other logically contiguous data as a step in the scrub process. Another element of corrective action is to rewrite the corrected data with a different rotation than they were originally written. For example, the four analog storage state ranges of a four state system can be originally designated to represent 00, 01, 10 and 11, respectively, and upon rewrite designated to represent 11, 10, 01 and 00. The conversion is made by the memory controller when the data are read, using data of the specific rotation that is kept as part of the overhead data or otherwise. Data rotation is beneficially applied to rewrites of both corrected data and data that did not need correction.

A further element of corrective action that may be included is to map out pages or blocks of memory that build up a history of being affected by disturbs much more than on average. This is detected by monitoring the number of data errors in various pages, blocks, planes and/or other defined regions of the array. Of course, care should be taken to prevent mapping out pages or blocks experiencing data errors for reasons other than a higher susceptibility to disturbs, such as because a block is being used more or differently than the average.

The scrubbing algorithm is usually controlled by the memory controller but could, alternatively, be controlled by the host. When controlled by the memory controller, the algorithm is coded into the memory system firmware that is typically executed by the microprocessor 21 (FIG. 1A) from the controller RAM 25 during operation of the memory.

The specific scrubbing algorithm that is utilized depends upon certain characteristics of the memory system, particularly of the memory devices 11 and 13 (FIG. 1A). Example characteristics are as follows:

(a) Number of host data sectors stored in the memory unit of programming (usually a page);
(b) Number of storage states of the memory cells and the extent of the threshold range designated for each storage state;
(c) Whether the unit of programming (usually a page) includes a single or multiple host data sectors;
(d) The number of units of programming (usually a page) in a unit of erase (usually a block); and
(e) The density of memory cells and the extent and specific tendency for an operation in one unit to cause data disturbs in another unit.

Specific Embodiment of Scrub

A more specific embodiment of a scrub algorithm is illustrated in the flowchart of FIG. 9. Generally, the same processing steps as described previously are utilized but the implementation shown in more detail, including margin scrub reads that are described with respect to FIG. 10 for a four state system example (2 bits stored in each physical charge storage unit). Two entry points to the processing are shown in FIG. 9, at 115 when a scrub trigger event is detected and at 117 when a command to execute deferred scrubs is received.

In the step 115, the memory is monitored for a scrub trigger event, as discussed above for the step 91 of FIG. 8. Similarly, in a step 119, candidate memory cell unit(s) are determined for scrub, the same as described for the step 93 of FIG. 8. Then, similar to the step 95, a step 121 of FIG. 9 determines whether the scrub on any of the candidate units should be deferred because of other system operations that need to be performed at the time. If so, as indicated at 123, addresses and other necessary data of the candidate cell units are temporarily stored and the process awaits completing the higher priority system operation to resume again. Alternatively, completion of the scrub operation can be deferred until a latter special command is received from the host or generated by the memory controller in the step 117, as is the case when deferred later in the process. After the data for the deferred scrub is stored in the step 123, the particular scrub operation being executed is ended unless there are more units to scrub, as determined by a step 124. If there are more units to scrub, the processing returns to the step 119.

A next step 125 performs the same function as the step 97 of FIG. 8, namely the selection of the candidate memory cell units to be scrubbed. Subsequent steps of FIG. 9 are carried out on one of the selected units at a time. A next step 126 causes the read breakpoint levels and other read conditions to initially be set to normal read levels. A step 127 then performs a scrub read under the set conditions on a first of the memory cell units, corresponding to the step 99 of FIG. 8. Subsequent steps are performed on this same one unit, with a loop 129 returning to the step 127 for the next of the selected units in order until they are all scrubbed. Of course, if only one unit is selected for scrubbing in a particular operation, there is no loop back 129.

After the scrub read of the step 127 with the read margins set in the step 126, a step 131 determines whether there are any data errors, similar to the step 101 of FIG. 8. If errors exist, a next step 133 determines whether the errors are correctable. When an ECC is used to ascertain the integrity of the data, then this step 133 determines whether the number of bad bits in the read unit of data are within the corrective capabilities of the particular ECC algorithm that is being used. If the errors can be corrected, a next step 135 determines whether correction is both necessary and desirable, corresponding to the step 103 of FIG. 8. The step 135 can be as simple as determining whether the number of erroneous but correctable bits is less than a threshold of one or a very few, in which case it may be determined not to take corrective action.

The decision in step 135 can also be affected by whether the data and their ECC are user data or overhead data. As described with respect to FIG. 3, overhead data can have its own ECC. When this is the case, the integrity of the user and overhead data can be checked separately in the steps 131 and 133, and even processed one at a time through the complete loop with the return 129 by considering the user data and their ECC as one unit and the overhead data and their ECC as another unit of data, even though they may be stored in the same page. Although use of the respective overhead and user data ECCs will usually be the same, the process can operate to more tightly maintain the integrity of the overhead data. This is an example of a balance between maintaining system performance, which excessive scrub operations degrade, and maintaining integrity of the stored data over the long term, which scrubbing is designed to achieve.

If the decision in step 135 is that correction of the correctable errors in the data unit of interest should be made, a next step 137 asks whether the correction of the data should be deferred. Scrub is desirably deferred, for example, if there are so many bad bits in the read data that their correction will take more time than is available at this stage. If not deferred, the errors are corrected in a step 139, similar to the step 107 of FIG. 8. A next step 140 then asks whether the corrective action should be deferred. Scrub is typically deferred if rewriting the data also involves movement of other data due to a necessary consolidation that will take more time than available. If there is no deferral, the corrected data are rewritten, in a step 141, according to one of the rewriting options described above when the general embodiment of FIG. 8 was described. After successful rewriting of the corrected unit of data, it is determined in a step 143 whether there are any other memory cell units that were selected in the step 125 for scrub. If so, a step 145 increments to the next unit in order and the processing returns via the loop 129 to the step 127 for that new unit.

So far, a main path of the flowchart of FIG. 9 has been described. But there are many several branches that may be entered along the way when resolution of some of the questions are different than those described above. A first such branch to be described is taken from the step 133 when so many data bit errors exist in the subject unit that they cannot be corrected by the ECC. As indicated by the step 151, the read threshold levels are set to be different from the levels used for the scrub read in the step 127, and then, in a step 153, the unit's data are read again with these different threshold levels. Such a margined read is illustrated in FIG. 10.

An example of operating the individual storage elements in a flash memory array in four states is used in FIG. 10. A distribution of the number of storage elements within a unit of memory cells, without disturbs, in each of four threshold voltage level ranges is shown. Threshold voltage guard bands 155, 156 and 157 are maintained between the storage state threshold level ranges with an absence of data from any cells therein. This is the desired programmed condition that exists immediately after programming and verifying the states of a unit of cells. But as other units are then programmed, read and/or erased, this data can be disturbed. Disturbs are exhibited by the threshold levels shifting to one side or the other into the adjacent guard bands. This can occur for a small proportion of the cells within each state distribution or the entire distribution can shift or spread into adjacent guard bands, depending upon the nature of the disturbs.

For a normal read, breakpoint levels 159, 160 and 161 in about the middle of the respective guard bands 155, 156 and 157 are used. That is, the threshold levels of the cells being read are compared with these breakpoint levels to determine their storage states. Errors occur when the threshold levels of cells within one state shift through a guard band across a breakpoint level. For example, when the threshold levels of cells in state 1 shift lower until they are below the breakpoint level 159, those cells are then read to be in state 0. Similarly, if the threshold levels of cells in state 1 shift higher until above the breakpoint level 160, a normal read will say that those cells are in state 2. Such read data errors are then identified by the ECC process. But when there are too many such errors for the ECC to correct, a second read with different breakpoint levels between states is made by steps 151 ands 153 (FIG. 9). The breakpoint levels 159, 160 and 161 are shifted within their respective guard bands in a direction of the expected shift of storage threshold levels from the disturbs, so that the shifted levels are now on the same side of the guard band as they were before being disturbed.

After so re-reading the data, it is determined in a step 165 by use of the ECC whether any data errors remain. If not, the processing then proceeds to the step 135 of the main processing path, including determining whether data correction and rewriting should be deferred. If data errors are discovered by the step 165 to exist, then a next step 167 determines whether they are correctable by the ECC. If so, the processing then also jumps to the step 135 of the main processing path.

But if the data errors are found by the step 167 to be uncorrectable, then a further read with even different break point levels may be included. In a step 169, it is determined whether there are any remaining untried relaxed read conditions. If so, retry conditions are incremented by a step 170 and the processing returns to the steps 151 and 153 to read the data with such new conditions. But if there are no more different read conditions provided for, then the data in the subject array unit must remain with its uncorrectable errors. The scrub operation on that unit is then determined to have failed. One result of this could be to copy all valid data to a new memory system and then discard the present memory. Another result is to simply mark this unit as bad, by a flag stored in overhead data or otherwise, and then proceed to the step 143 to continue the scrubbing of other array units. The data in that unit is then lost. Since these data were verified as part of the original programming to initially be in their correct threshold level range, this possible result of an accumulation of disturbing operations over time shows the desirability of scrubbing frequently enough to such an adverse consequence.

Returning to the step 135, if it is there determined that correction of the data is neither necessary nor desirable, the processing jumps to the step 143 to continue scrub with any additional of the identified units. Also returning to the steps 137 and 140, if it is determined that correction or re-writing of the data should be deferred, then the read data, their addresses, the ECC and any identification of erroneous bits and other previously determine data are stored in a step 171 and the processing then jumps to the step 143. These data are then read when the deferred actions are reached for completion, as described below.

Returning to the step 131, the next action after determining that there are no data errors could be to do nothing further with the data of the current unit by jumping to the step 143. But it can be desirable to further check and adjust the storage levels of cells from which even valid data are read. This involves re-reading the data with different break point levels than used in the initial read, in order to identify any cells where the stored charge has moved into a guard band between the levels defined for the various states (see FIG. 10), even though those levels have not crossed a breakpoint level to cause a normal read data error. By a step 172, it is determined whether any such read conditions exist that have not already been tried. If so, a step 173 causes new breakpoint levels and/or other scrub read conditions to be selected. The processing then returns to the step 126 where those read conditions are set and the data then read in the step 127 with those conditions. The breakpoint levels used during this read, for example, are shifted to the edges of the guard bands 155, 156 and 157 of FIG. 10. If, in the step 131, it is determined by use of the ECC that data errors exist, the erroneous bits of data indicate the shifting of charge levels to within the guard bands. So it is desirable to correct and rewrite these data, after first determining whether such action should be deferred, so that the stored charge levels will be shifted out of the guard bands to within their intended state distributions of FIG. 10.

If it is determined in the step 131 that there are no errors in the data read with the more restrictive margins, the processing on the current unit of data is ended. It is then determined by the step 172 whether there are more defined scrub read conditions that have not yet been tried with this unit of data. If so, the data may be read again with even tighter breakpoint levels. That is, the data may be read for the second time with a first set of alternate read conditions available in the step 172 with breakpoint levels shifted only a part of the way along their respective guard bands and then repeated this third time with the breakpoint levels of a second set of alternate read conditions selected by the step 172 moved even further toward the guard band edges for further fine adjustment of the charge storage levels, if necessary. As many such additional scrub read conditions may be provided as is practical.

Returning to the step 135, where it can be determined to accept some level of data errors without correction, it will be noted that this is inconsistent with the preciseness of the adjustments made by the branch of steps 172 and 173 to the stored data that contain no errors that have just been described. Therefore, if this processing branch is utilized, the step 135 most likely will not allow acceptance of erroneous data without correction.

After it is determined in the step 143 that all the data units currently identified for scrub have indeed been scrubbed, any of these data units that has shown an extraordinary propensity for having its data disturbed may optionally be mapped out of the system. A step 185 determines whether there are any such physical memory units that should be removed from the system, and, if so, they are mapped out by a step 187. The scrub operation is then complete.

However, if data corrections and/or re-writes have been deferred, the memory system controller or the host system will have this noted. At an appropriate time, when there are no higher priority memory operations pending, the scrubbing of partially scrubbed units may be completed, beginning with the step 117. The data, ECC and other information stored for one unit by the step 171 is read by a step 191. If the data from that unit needs correction, then that is done in a step 193. In a step 195, the correct data is re-written. If there are no other partially competed scrub operations that need to be competed, then this is determined in a step 197 and the step 185 is either executed or the processing ended. If there are other units to be completed, the processing increments to the next unit, in a step 199, and the steps 191, 193 and 195 are then repeated on the data from those units.

In the case where addresses of candidate memory cell units are stored in the step 123 for a deferred scrub, the processing can automatically return to continue the scrub operation for one of the deferred units at a time when the controller has no higher priority actions to implement. Since the deferral step 121 is so early in the processing of FIG. 9, a return to a unit then deferred results in a resumption of the processing beginning with the step 125 and continue along that path, as described above. It is possible for correction and/or rewriting of such a unit to again be deferred at one of the steps 137 or 140.

Conclusion

Although the various aspects of the present invention have been described with respect to exemplary embodiments thereof, it will be understood that the present invention is entitled to protection within the full scope of the appended claims.

The invention claimed is:

1. A non-volatile memory system, comprising:
    an array of flash memory cells organized into blocks of a minimum number of memory cells that are erasable together and the blocks individually storing a plurality of units of data, and
    a controller coupled with the memory cell array and that operates to:
        identify when a scrub trigger event has occurred for data stored in at least one of the units of data in a first one of the blocks,
        read the identified at least one unit of data from the first block, correct any errors in the data read from the first block to provide corrected first block data, write the corrected first block data as at least one unit of data to a second one of the blocks, and thereafter copy uncorrected data units of the first block into the second block, thereby to consolidate in the second block corrected and uncorrected units of data originally of the first block.

2. The memory system claim 1, wherein the controller, prior to writing the corrected first block data into the second block, additionally operates to temporarily store the corrected first block data in a third block.

3. The memory system claim 2, wherein the controller additionally operates to:

identify when a disturbing event has occurred for at least one of the units of data stored in a fourth one of the blocks, read the identified at least one unit of data from the fourth block, correct any errors in the data read from the fourth block to provide corrected fourth block data, temporarily store the corrected fourth block data in the third block, thereafter write the corrected fourth block data as at least one unit of data to a fifth one of the block, and thereafter copy uncorrected data units of the fourth block into the fifth block, thereby to consolidate in the fifth block corrected and uncorrected units of data originally of the fourth block.

4. The memory system claim 1, wherein the controller additionally operates to recognize the scrub trigger event to include an event disturbing said at least one of the data units stored in the first block.

5. The memory system claim 1, wherein the controller additionally operates to pause the operation after reading the data but before correcting any errors thereof, until other higher priority operations are performed.

6. The memory system claim 1, wherein the controller additionally operates to pause the operation after correcting any errors thereof but before writing the corrected data, until other higher priority operations are performed.

7. A non-volatile memory system, comprising:

an array of flash memory cells, and a controller coupled with the memory cell array and that operates to:

identify when a scrub trigger event has occurred for data stored in at least one location of the array, read the data stored in said at least one location in the array, temporarily store information about said at least one location and the data read therefrom, while this information remains stored, program or read other data to or from at least locations within the array other than said at least one location, thereafter determine whether there are any errors in the data read from said at least one location in the array, utilize the stored information to correct any errors in the data read from said at least one location in the array, and write the corrected data into the array.

8. The memory system of claim 7, wherein the controller further operates to recognize an event disturbing data stored in said at least one location in the array as a scrub trigger event.

9. A non-volatile memory system, comprising:

an array of flash memory cells, a controller coupled with the memory cell array and that operates to:

identify when a scrub trigger event has occurred for data stored in at least one location of the array, read the data stored in said at least one location in the array, thereafter determine whether there are any errors in the data read from said at least one location in the array, correct any errors in the data read from said at least one location in the array, temporarily store the corrected data, while the corrected data remain temporarily stored, program or read other data to or from at least locations within the array other than said at least one location, and thereafter writing the corrected data into the memory cell array.

10. The memory system of claim 9, wherein the controller further operates to recognize an event disturbing the data stored in said at least one location in the array as a scrub trigger event.

11. A memory system, comprising:

an array of erasable and re-programmable non-volatile memory cells organized into blocks of a minimum number of memory cells that are erasable together and that individually include a plurality of pages which individually store one or more units of data, a controller coupled with the memory cell array and that operates to:

in response to the occurrence of at least one of a plurality of predefined events, identify at least one page of at least one block to be scrubbed, read data stored in said at least one page with a first set of read conditions, determine whether there are any errors in the read data, and, if so, whether the errors can be corrected, in response to determining that the errors in the read data cannot be corrected, re-read the data stored in said at least one page with a second set of read conditions, determine whether there are any errors in the re-read data, and, if so, whether the errors can be corrected, in response to other memory activity being scheduled, deferr further action with respect to the read or re-read data, after the other memory activity is completed and in response to determining that the errors in either of the read or re-read data can be corrected, correct such errors to provide corrected data, and write the corrected data into at least a second page of a second block different from said one block.

12. The memory system of claim 11, wherein the controller additionally operates to copy unchanged data from pages within said at least one block into the second block.

13. A memory system, comprising:

a plurality of groups of re-programmable non-volatile memory cells that store data as levels of charge therein, wherein the groups individually store a plurality of units of data, and a controller coupled with the memory cells and which operates as follows:

in response to the occurrence of at least one predefined condition, data are read from at least one unit of a first group of memory cells, it is then determined whether there are any errors in the read data, in response to at least errors being determined to exist in the read data, an effort is made to recover the data erroneously read from said at least one unit of the first group, if recovered, the recovered data are written into at least one unit of a second group of memory cells different from the first group of memory cells, and data read without errors from other units of the first group of memory cells are copied into units of the second group of memory cells other than its said at least one unit, thereby to consolidate in the second block data read without errors and recovered data originally of the first block.

14. The memory system of claim 13, wherein the controller further operates, before the recovered data are written into said at least one unit of the second group, to write the recovered data into a third group different from the first and second groups along with data recovered from at least one group other than the first, second or third groups, and thereafter copy the recovered data from the third group into the second group and copy data read without errors from other units of the first group into the second group.

15. The memory system of claim 13, wherein the controller further operates to recover the erroneously read data by using an error correction code read along with the data to recover the erroneously read data.

16. The memory system of claim 15, wherein the controller operates to recover the erroneously read data, if the use of the error correction code is not successful, by re-reading the data under different conditions than the data are initially read.

17. The memory system of claim 13, wherein the controller recognizes said at least one predefined condition to include any one or more of programming, reading or erasing memory cells having at least one conductor in common with at least some of the memory cells of said at least one unit of the first group of memory cells.

18. The memory system of claim 13, wherein the controller operates to recognize said at least one predefined condition to include receiving a command from a host to which the groups of memory cells are operably connected through the controller.

19. The memory system of claim 13, wherein the controller operates to recognize said at least one predefined condition to include storage of current data in said at least one unit of a first group of memory cells for fewer than a predefined number of memory operations.

20. The memory system of claim 13, wherein the controller operates to recognize said at least one predefined condition to include an identification of said at least one unit of the first group of memory cells by a deterministic or random sequence.

21. The memory system of claim 13, wherein the controller further operates to simultaneously erase the memory cells in individual ones of the groups.

22. The memory system of claim 13, wherein the controller further operates to simultaneously program the memory cells receiving individual ones of the units of data.

23. A memory system, comprising:

groups of re-programmable non-volatile memory cells that store data as levels of charge therein, wherein individual ones of the groups store a plurality of units of data, and a controller coupled with the memory cells and which operates to:

read data from at least a first group of memory cells, thereafter determine whether there are any errors in the data read from at least one unit of the first group of memory cells, in response to at least errors being determined to exist in the read data, an effort is made to recover the data erroneously read from said at least one unit of the first group, if recovered, the recovered data are written into at least one unit of a second group of memory cells different from the first group of memory cells, and data read without errors from other units of the first group of memory cells are copied into units of the second group of memory cells other than its said at least one unit, thereby to consolidate in the second block data read without errors and recovered data originally of the first block.

24. The memory system of claim 23, wherein the controller further operates, before the recovered data are written into said at least one unit of the second group, to write the recovered data into a third group different from the first and second groups along with data recovered from at least one group other than the first, second or third groups, and thereafter copy the recovered data from the third group into the second group and copy data read without errors from other units of the first group into the second group.

25. The memory system of claim 23, wherein the controller further operates to include use of an error correction code read along with the data as part of the effort to recover the erroneously read data.

26. The memory system of claim 25, wherein the controller further operates, as part of the effort to recover the erroneously read data if the use of the error correction code is not successful, to re-read the data under different conditions than the data are initially read.

27. The memory system of claim 23, wherein the controller further operates to simultaneously erase the memory cells in individual ones of the groups.

28. The memory system of claim 23, wherein the controller further operates to simultaneously program the memory cells receiving individual ones of the units of data.

* * * * *